(12) United States Patent
Ellinger et al.

(10) Patent No.: US 10,354,963 B2
(45) Date of Patent: Jul. 16, 2019

(54) DECODING INFORMATION EMBEDDED IN AN ELECTRONIC ELEMENT

(71) Applicant: Eastman Kodak Company, Rochester, NY (US)

(72) Inventors: Carolyn Rae Ellinger, Rochester, NY (US); William Yurich Fowlkes, Pittsford, NY (US); Kevin Edward Spaulding, Spencerport, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/838,735

(22) Filed: Dec. 12, 2017

(65) Prior Publication Data

US 2019/0181102 A1  Jun. 13, 2019

(51) Int. Cl.

| | |
|---|---|
| *H01L 23/00* | (2006.01) |
| *G06K 7/14* | (2006.01) |
| *G06K 7/10* | (2006.01) |
| *G06F 16/955* | (2019.01) |
| *H01L 49/02* | (2006.01) |
| *H01L 29/786* | (2006.01) |

(52) U.S. Cl.
CPC ........ *H01L 23/573* (2013.01); *G06F 16/9554* (2019.01); *G06K 7/10821* (2013.01); *G06K 7/1439* (2013.01); *H01L 28/40* (2013.01); *H01L 29/786* (2013.01)

(58) Field of Classification Search
CPC ..... H01L 23/573; H01L 28/40; H01L 29/786; G06F 16/9554; G06F 17/30879; G07K 7/10821; G07K 7/1439

USPC ......................................... 235/375, 487, 492
See application file for complete search history.

(56) References Cited

U.S. PATENT DOCUMENTS

| | | | |
|---|---|---|---|
| 5,214,530 A * | 5/1993 | Coombs ................. | G02B 5/285 283/91 |
| 6,859,323 B1 | 2/2005 | Gasloli et al. | |
| 7,224,528 B2 * | 5/2007 | Phillips .................. | B32B 27/36 359/576 |
| 7,564,628 B2 * | 7/2009 | Barth .................... | G02B 5/0875 359/582 |
| 7,608,330 B2 * | 10/2009 | Argoitia ................ | C09C 1/0015 359/580 |

(Continued)

OTHER PUBLICATIONS

O. Stenzel, "The Physics of Thin Film Optical Spectra: An Introduction", Springer-Verlag Berlin Heidelberg, Germany(2005).

*Primary Examiner* — Paultep Savusdiphol
(74) *Attorney, Agent, or Firm* — Kevin E. Spaulding

(57) ABSTRACT

A pattern of information is detected in a thin-film electrical element including a plurality of thin-film layers on a substrate, the plurality of thin-film layers overlapping in an encoding region to form an optical layer structure. At least one of the thin-film layers in the optical layer structure includes an embedded information-encoding pattern. The thin-film electrical element is illuminated with an incident light beam from a light source thereby producing an optically-detectable interference image including the embedded pattern of information. An image capture system is used to capture an image of the optically-detectable interference image, and a data processing system is used to analyze the captured image to detect the embedded pattern of information. One or more actions are initiated in response to the detected pattern of information.

9 Claims, 18 Drawing Sheets

(56) References Cited

U.S. PATENT DOCUMENTS

| | | |
|---|---|---|
| 8,242,793 B2 | 8/2012 | Kumhyr et al. |
| 8,361,544 B2 | 1/2013 | Fedorovskaya et al. |
| 2003/0156294 A1* | 8/2003 | D'Agraives ....... G06K 9/00577 |
| | | 356/450 |
| 2009/0130858 A1 | 5/2009 | Levy |
| 2015/0002346 A1 | 1/2015 | Subbaraman et al. |
| 2016/0126344 A1 | 5/2016 | Ellinger et al. |
| 2018/0249070 A1* | 8/2018 | Lau ................... H04N 5/23222 |

\* cited by examiner

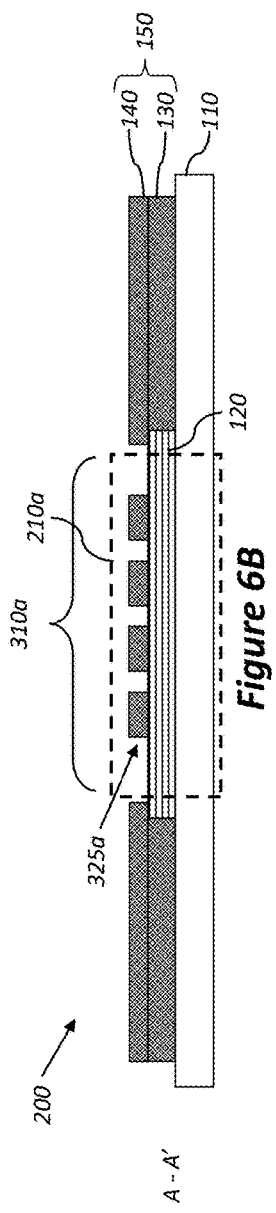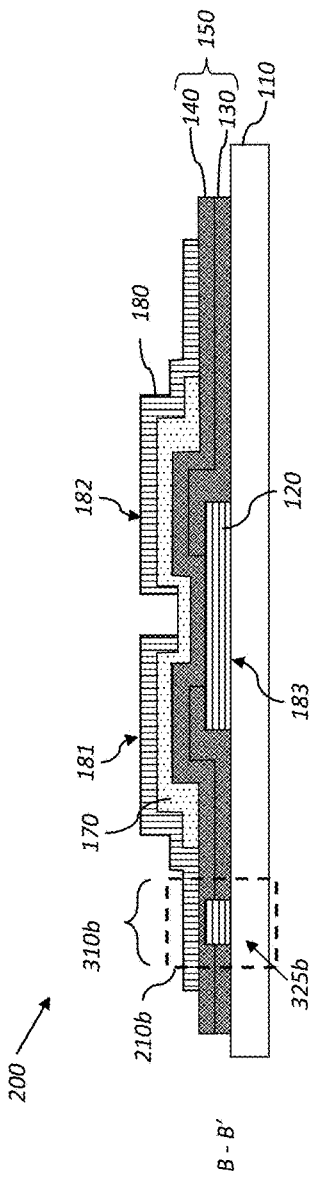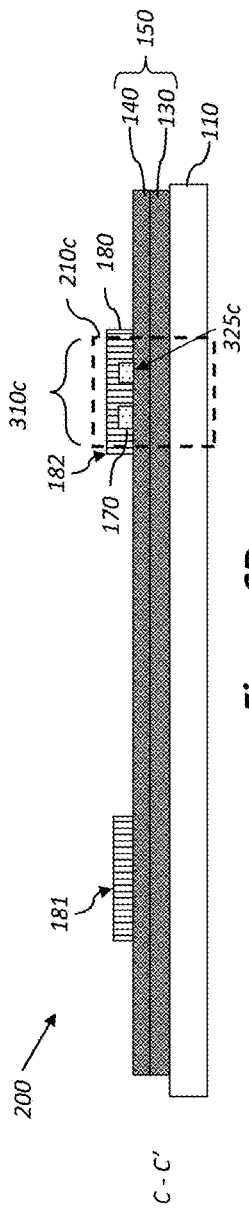

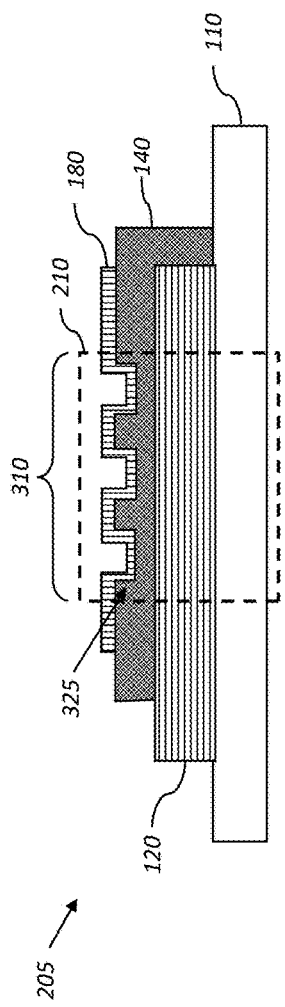
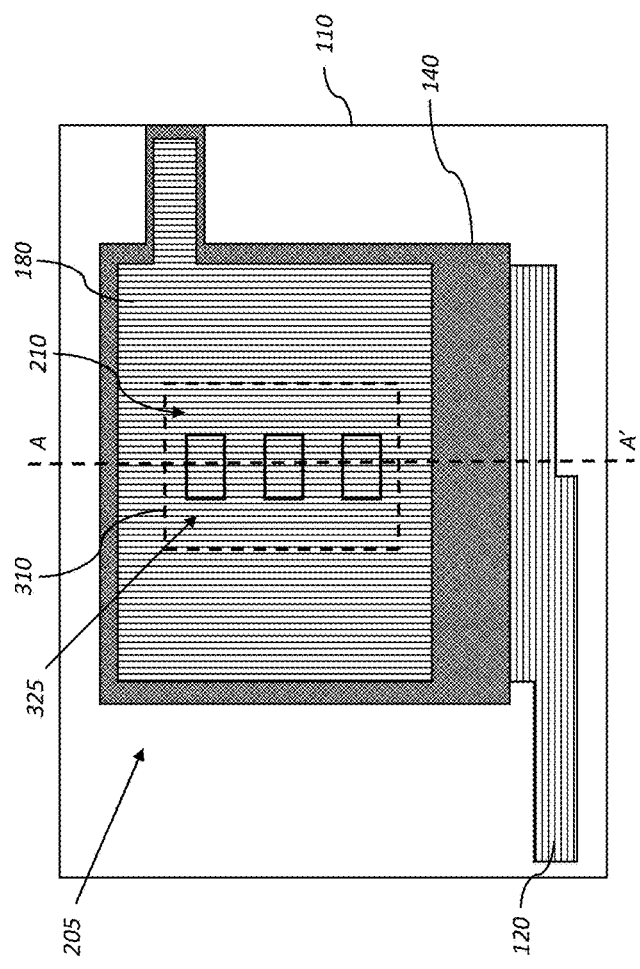

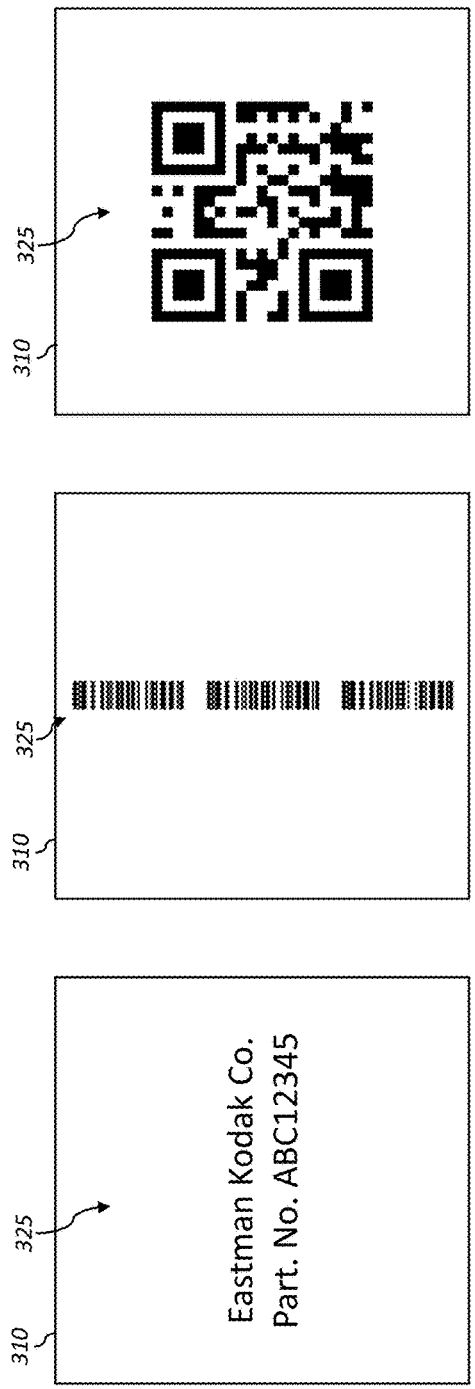
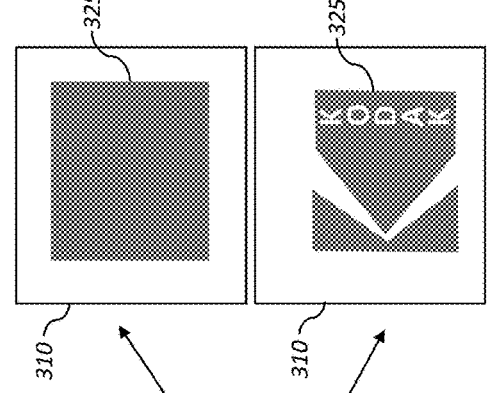
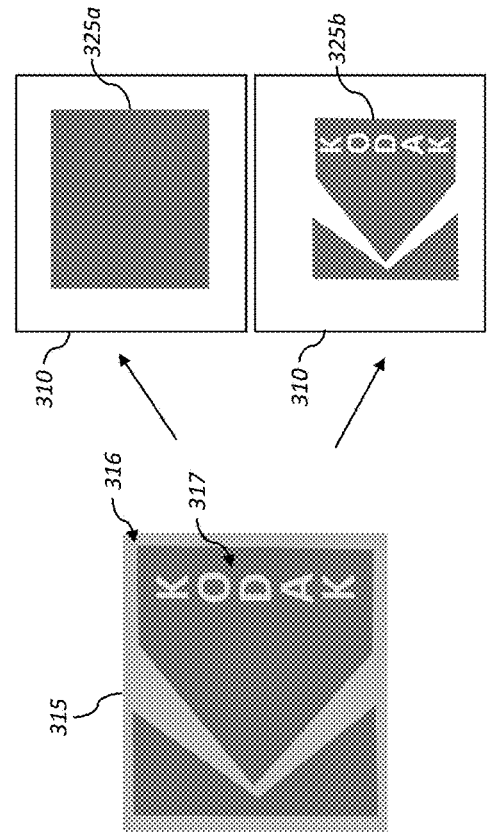
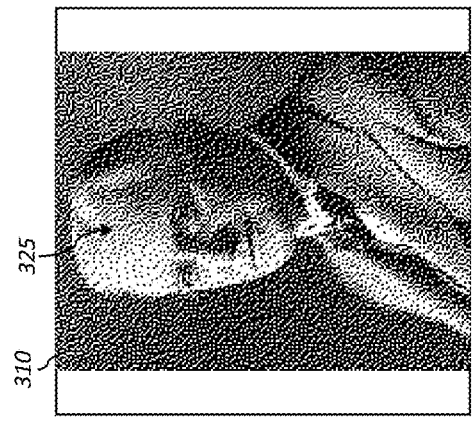
*Figure 14A*
*Figure 14B*
*Figure 14C*
*Figure 14D*
*Figure 14E*

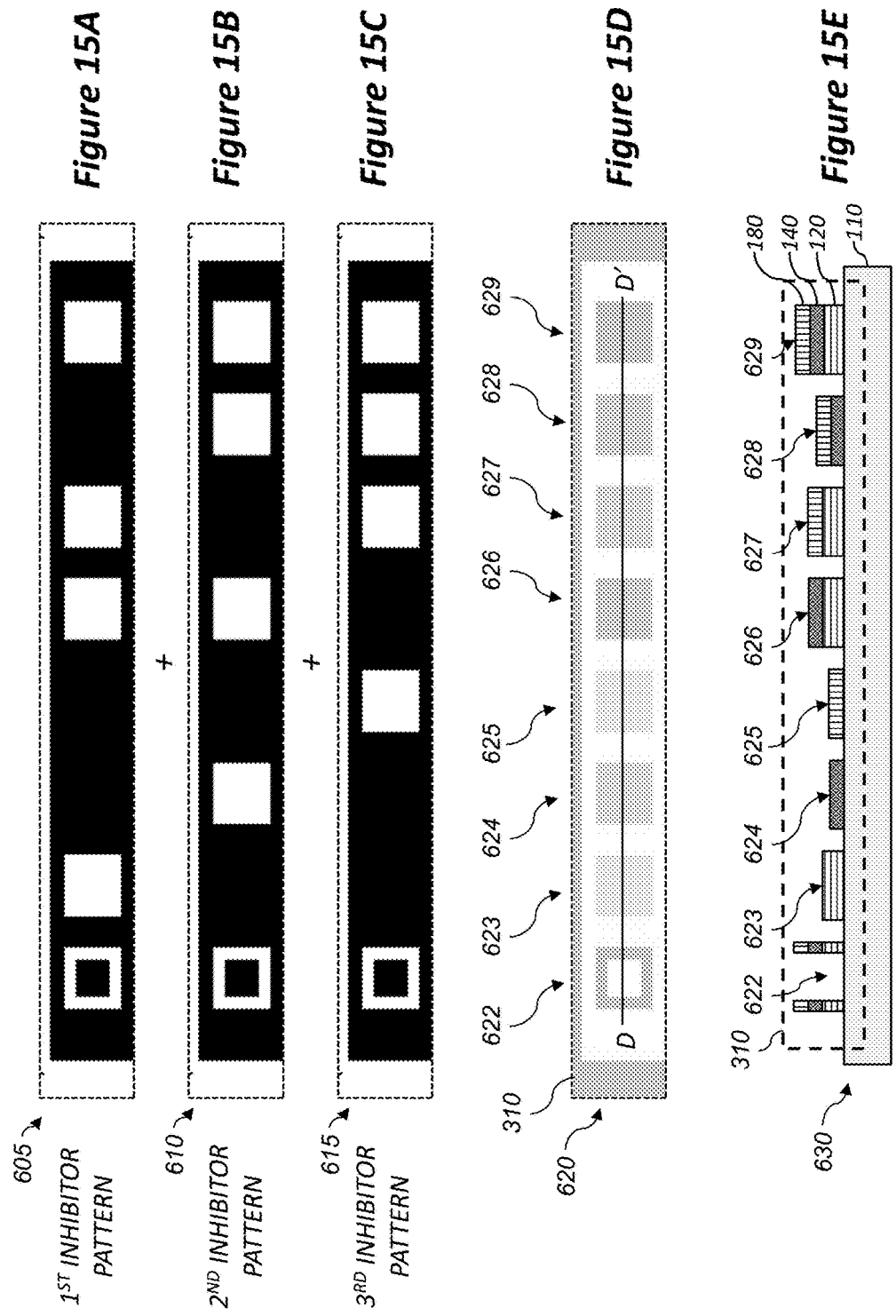

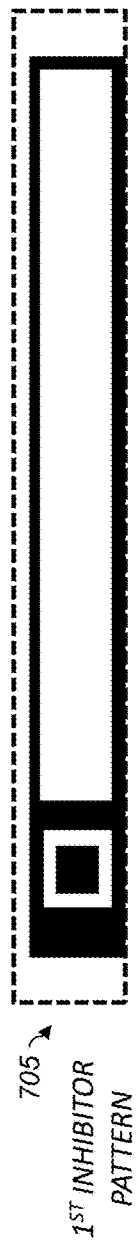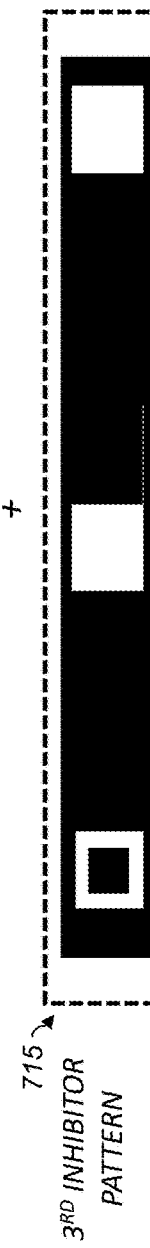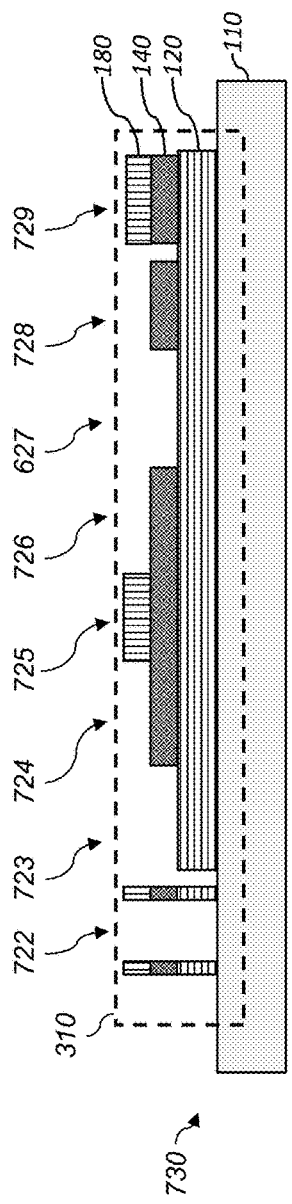

DECODING INFORMATION EMBEDDED IN AN ELECTRONIC ELEMENT

CROSS-REFERENCE TO RELATED APPLICATIONS

Reference is made to commonly assigned, co-pending U.S. patent application Ser. No. 15/838,689, entitled: "Electronic element with embedded information," by C. Ellinger et al.; and to commonly assigned, co-pending U.S. patent application Ser. No. 15/838,716, entitled: "Embedding information in an electronic element," by C. Ellinger et al., each which is incorporated herein by reference.

FIELD OF THE INVENTION

This invention relates generally to thin film electronic devices, and more particularly to a method of decoding optically-detectable information embedded in thin film electronic devices.

BACKGROUND OF THE INVENTION

The electronic and manufacturing issues associated with thin film transistors (TFTs) can be viewed as representative of the electronic and manufacturing issues associated with many thin film electrical components. TFTs are widely used as switching elements in electronics, for example, in active-matrix liquid-crystal displays, smart cards, and a variety of other electronic devices and components thereof. Diodes, solar cells, liquid crystal displays, thin-film memory and other printed electronics are examples of components of electronic devices that can all be made using the same processes used to form thin film transistors.

As noted in U.S. Pat. No. 8,242,793 to Kumhyr et al., entitled "Electromagnetic profiling to validate electronic device authenticity," much of the value found in electronic devices is developed during the design of the electronic devices rather than the manufacture of the electronic devices. For example, an integrated circuit processor or thin film device often results from an intense and expensive development process, but the actual materials used to build the integrated circuit processor or thin film device typically cost only a few dollars. To protect the investment made during development, manufacturers attempt to keep circuit designs from becoming public so that counterfeiters cannot copy the designs and produce counterfeit circuits. In some instances, however, counterfeiters reverse-engineer the design, or the functions performed by the design, to create counterfeit devices. A counterfeiter hides the misdeed by simply labeling the counterfeit device with a counterfeited identifier. An end user who purchases a device with counterfeit electronic device components often has no idea unless something goes wrong.

The presence of counterfeit electronic devices or electronic components within an electronic device presents a number of business risks and security risks. With respect to business risks, an enterprise that purchases a device from a name brand manufacturer typically pays more for the device relative to competitive devices under the assumption that the name brand device has a higher quality, with better performance and reliability. Manufacturers who have their products counterfeited risk a loss in reputation because of failures associated with counterfeit components. Components that do not function up to the original manufacture specifications expose the end user to unplanned outages and denial of warranty service, while the manufacturer is exposed to potential liability for fixing systems that the manufacturer did not build or sell. For example, the manufacturer may not recognize the counterfeit components or may elect to provide warranty service to protect its reputation.

U.S. Patent Application Publication 2015/0002346 to Subbaraman et al., entitled "Integrated printed decorative antenna and electronics," suggests printing a decorative image onto printed electronic circuits. For example, a printed decorative image atop the layer of a printed antenna structure, wherein the printed antenna structure is substantially concealed by the printed decorative image. While a good process for adding indicia, any process that involves a separate printing step to form the decorative image, is easily defeated by the counterfeiter who merely needs to copy the indicia and print the information directly onto the counterfeit electronic devices or electronic device components. The counterfeiter hides the misdeed by simply labeling the counterfeit microcontroller with the counterfeited indicia.

In addition to counterfeit protection, there is a broader need for embedded information to be co-located with electronic devices. Other uses for embedded information include operating instructions, testing protocols, product traceability information, marketing or other peripheral communications and more. To-date there have been no solutions that have enabled embedded information to be co-located with electrical devices which make use of the properties of the transparent thin-films of today's electronics.

Therefore, there remains a need for embedding information directly into electronics with no additional process steps. The embedded information should be detectible and decodeable for its intended purpose. For counterfeit prevention, easily detectable information will enable customers to be able to verify that the manufacturers' product is genuine.

SUMMARY OF THE INVENTION

The present invention represents a method for decoding a pattern of information embedded in an electrical element, including:

receiving a thin-film electrical element including a plurality of thin-film layers on a substrate, the plurality of thin-film layers overlapping in an encoding region to form an optical layer structure, wherein at least one of the thin-film layers in the optical layer structure contributes to an electrical function of the electrical element, and wherein at least one of the thin-film layers in the optical layer structure includes an information-encoding pattern which contributes to the optically-detectable interference image;

illuminating the thin-film electrical element with an incident light beam from a light source thereby producing an optically-detectable interference image including the embedded pattern of information;

using an image capture system to capture an image of the optically-detectable interference image to form a captured image;

using a data processing system to analyze the captured image of the optically-detectable interference image to detect the embedded pattern of information; and initiating one or more actions in response to the detected pattern of information.

This invention has the advantage that the detection of the embedded pattern of information can provide an image authentication feature to detect counterfeit electrical elements.

It has the additional advantage that the detected pattern of information can be used to access information about the electrical element or to control the electrical element.

BRIEF DESCRIPTION OF THE DRAWINGS

FIGS. 6A-6D illustrate a bottom-gate thin-film transistor having embedded information encoding patterns in three encoding regions to provide optically-detectable interference images;

FIGS. 8A-8B illustrate a thin-film capacitor having an embedded information encoding pattern formed by modifying the thickness of the dielectric layer;

FIGS. 14A-14E illustrate exemplary information encoding patterns that can be used to encode different types of patterns of information;

FIGS. 15A-15E illustrate eight possible combinations of thin-film layers available using three material layers and any combination of inhibitor patterns;

FIGS. 16A-16D illustrate four possible combinations of thin-film layers available using three material layers, where the inhibitor layers are left in place between each coating step;

Figure 1:
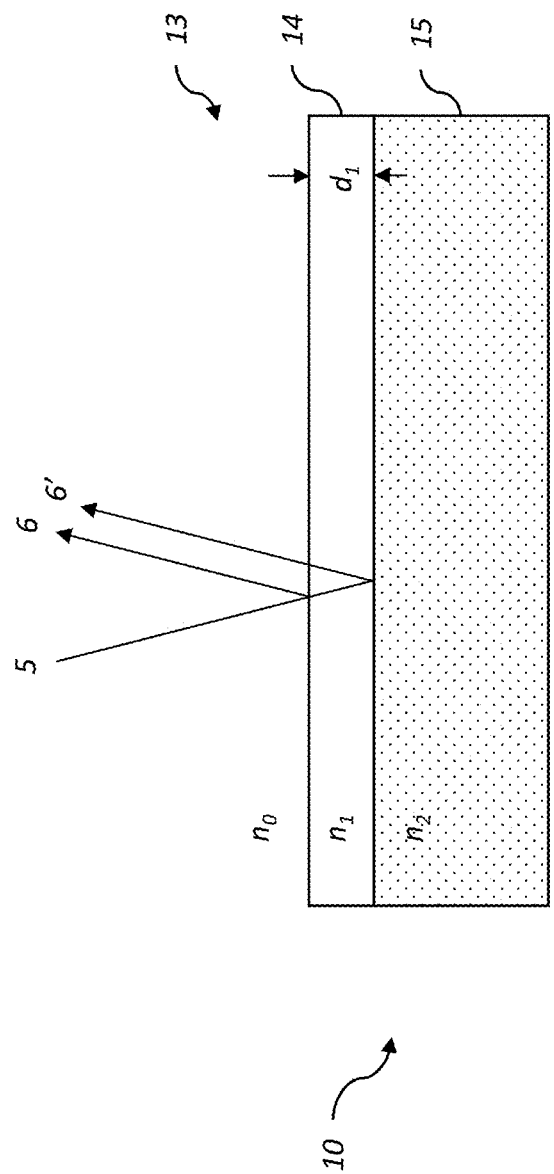
FIG. 1 is an illustration of thin film interference.

It is to be understood that the attached drawings are for purposes of illustrating the concepts of the invention and may not be to scale.

DETAILED DESCRIPTION OF THE INVENTION

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," "right" are used with reference to the orientation of the figure(s) being described. Because components of embodiments of the present invention can be positioned in a number of different orientations, the directional terminology is used for purposes of illustration only and is in no way limiting.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and may not be to scale for the sake of clarity. The Figures are intended to show overall function and the structural arrangement of some embodiments of the present invention. One of ordinary skill in the art will be able to readily determine the specific size and interconnections of the elements of the example embodiments of the present invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense.

Even though specific embodiments of the invention have been described herein, it should be noted that the present invention is not limited to these embodiments. Any features described with respect to one embodiment may also be used in other embodiments, where compatible. The features of the different embodiments can be exchanged, where compatible.

As discussed earlier, there is a need for a method of embedding information into an electrical element in order to thwart counterfeiting. The embedding of information also has additional applications beyond that of anti-counterfeiting. In some applications, in addition to being optically detectable, the embedded information can be used to affect the electrical performance of the electrical element. Such electrical elements can be designed to have a specified combination of electrical performance and optically detectable information for use in applications as anti-counterfeiting labels for any object. For printed electronics applications, it can be useful to include embedded information along with providing a specified electrical performance. For example, the embedded information may include QR codes, or other optically detectable patterns that can be used to access information specific to the usage of a given device.

It is known that light interacts with stacks of transparent materials in the form of thin-film layers, producing visibly-detectable interference colors, which are dependent on the properties of the thin-film materials in the stack. Complex optical coatings (or stacks) consisting of multiple layers of thin-film materials can be configured to exhibit high reflection over some range of wavelengths and anti-reflection over another range, enabling the production of dichroic thin-film optical filters, such as described for example in U.S. Pat. No. 6,859,323 to Gasloli et al., entitled "Dichroic neutral density optical filter."

Optical interference filters consist of multiple layers of coatings (often dielectric layers) on a substrate, which have different refractive indices and whose spectral properties are the result of wave interference effects that take place between the incident and reflected light of different wavelengths at the thin film boundaries. As is well-known in the art, interference is a phenomenon in which two waves superpose to form a resultant wave of greater, lower, or the same amplitude. Interference usually refers to the interaction of waves that are correlated or coherent with each other because they come from the same source. The principle of superposition of waves states that when two or more propagating waves of same type are incident on the same point, the resultant amplitude at that point is equal to the vector sum of the amplitudes of the individual waves. If a crest of a wave meets a crest of another wave of the same frequency at the same point, then the amplitude is the sum of the individual amplitudes—this is constructive interference. If a crest of one wave meets a trough of another wave, then the amplitude is equal to the difference in the individual amplitudes—this is known as destructive interference.

Typically, optical interference filters reflect one or more spectral bands and transmit others, while maintaining a nearly zero coefficient of absorption for all wavelengths of interest, however any stack of optically transparent films that vary in refractive index will produce an interference color. When stacks of transparent thin-film materials are patterned, interference color patterns are formed. For example, interference filters can be patterned in arrays, such as color filter arrays, and used to modify and control the composition of reflected and transmitted light for displays, optical waveguides, optical switches, light sensors in the back of the cameras, etc.

An example of fabricating electronic devices including optical interference filters arranged as color filter arrays (CFAs) was previously described in commonly-assigned U.S. Pat. No. 8,361,544 to Fedorovskaya et al., entitled "Thin film electronic device fabrication process," which is incorporated herein by reference. For image sensors, such as those used in digital cameras, a CFA is used in front of a panchromatic sensor to allow the detection of color signals. The CFA typically includes an array of red, green and blue areas laid down in a specified pattern. A common CFA pattern used in digital cameras is the well-known Bayer pattern array. The resolution of each color is reduced by as little as possible through the use of a 2×2 tile, where green is the chosen to be sensed twice in each tile because it is the one to which the human eye is most sensitive.

Embodiments of the present invention relate to thin-film electrical devices which include the feature of embedded optical information, and methods of making said devices. Electronic devices of the present invention include individual electrical elements, such as transistors, resistors, conductive traces and capacitors, as well as complete electrical circuits, and objects containing multiple electrical circuits.

Thin-film electrical elements are formed from electrically-functional thin-film layers. Such electrically-functional thin-film layers include electrically conductive layers, semiconductor layers and dielectric layers. The electrically-functional thin-film layers also have optical properties which are useful for forming the optically-detectable image patterns of embedded information in accordance with the present invention. The electrically-functional layers can be optically opaque (absorbing or reflecting) or optically transparent, and the details of these optical properties can vary as a function of the wavelength of light and the incidence and viewing angles.

An optically-detectable pattern of embedded information is an image which is formed by the interaction of a physical or structural pattern in the electrically-functional thin-film layers with incident light. The details of the both the patterned thin-film layers, and the nature of the incident light are important to the optical properties that are observed, or detected. The optically-detectable patterns corresponding to the physical patterns can be human decodable (e.g., text or imagery), or can be machine decodable (e.g., QR codes or barcodes). In some embodiments, the thin-film patterns result in both an optically-detectable interference image and a modification of the electronic function as described below. The optically-detectable pattern can be designed for detection with or without visual aids such as magnification optics, controlled lighting or a controlled detection mechanism.

In an exemplary embodiment, the optically-detectable pattern of embedded information corresponds to at least one optical layer structure having an encoding region with a defined perimeter that overlaps with a functional portion of at least one electrical device. Image patterns (e.g., QR codes, indicia, or other embedded messages) result from structural information-encoding patterns in one or more of the layers in the optical layer structure. Structural information-encoding patterns generally are x-y (lateral or substrate plane) patterns of material in a material layer, meaning regions in the x-y plane where material is present and regions where no material is present. Information-encoding patterns of material in one or more material layers contribute to an optically-detectable interference image when illuminated by incident light. The optically-detectable interference image results from the localized variations of the thin-film materials stack in the optical layer structure or structures. An optical layer structure is formed according to the information-encoding patterns within one or more of the material layers in order to modulate the characteristics of the reflected light as a function of x-y position. Within the context of the present disclosure, the term "optical layer structure" will be used to refer to a plurality of patterned thin-film layers that overlap in an encoding region to provide spatially-varying thin-film stacks such that an optically-detectable image pattern is formed in an encoding region.

Generally speaking, light can be modulated to form detectable image patterns by several means, which can be used singly or in combination in the optical layer structure, including light scattering, light absorption (color specific or panchromatic), specular reflection, and light interference. For example, image contrast that produces readable information can be produced by placing locally scattering structures on a specularly reflective surface or absorbing structures on a light scattering surface. Graphic printing is done by placing absorbing inks on a light scattering surface such as paper to modulate the light. In accordance with the present invention, the optically-detectable image pattern is provided, at least in part, by an interference image produced by the interaction of incident light with the spatially-varying thin-film stack.

An interference image is formed by light being reflected or transmitted through layers of material that modulate the light wave phase to create regions of constructive and destructive interference. The optically-detectable interference image is formed by the wavelength-dependent interference occurring at different spatial locations in an encoding region associated with an optical layer structure. The refractive indices and thicknesses of the transparent layers in the optical layer structure contribute to the colored interference patterns that are generated. Within the context of the present disclosure, a "transparent layer" is a layer that is at least partially optically transparent over at least a portion of the visible wavelength range. Preferably the transparent layer is at least 50% transmissive to incident light in at least some portion of the visible wavelength range. The transparent layer may also absorb, scatter or reflect a portion of the incident light.

FIG. 1 illustrates a simple model of thin film interference produced in air $13$ having a refractive index $n_0=1$. A thin-film stack $10$ having layers $14$, $15$ is illuminated by a monochromatic incident light wave $5$, which is reflected from the upper and lower surfaces of a transparent layer $14$ of a material with a refractive index $n_1>1$ to produce reflected light waves $6$ and $6'$ that are correlated or coherent with each other because they come from the same source. The reflected light waves $6$ and $6'$ will have a phase change between them either enhancing or reducing the reflected light by constructive or destructive interference. Although FIG. 1 shows the light incident at an angle for clarity, this analysis simply assumes the light is normally incident. A complete analysis of interference, including angles of incidence and propagation in the layers, multiple layers, phase change at reflective boundaries, reflective vs. transmissive light propagation, panchromatic illumination, etc., is not presented here, but the same principle of superposition of waves states to produce light modulation in the image region applies.

As shown, with $n_1>n_0$, the reflected light wave $6$ is reflected with no phase change relative to the incident light. The reflected light wave $6'$ reflected from the lower surface, assuming a reflective layer $15$ of a material with a refractive index $n_2>n_1$, also has no phase change due to the reflection, but does have a phase change relative to the reflected light wave $6$ due to the distance it propagates through layer $14$. The wavelength of the light $\lambda_1$ in layer $14$ is given by:

$$\lambda_1=\lambda_0/n_1 \quad (1)$$

where $\lambda_0$ is the wavelength of light in air. In the case where twice the thickness $d_1$ of the transparent layer $14$ is equal to an integer multiple of $\lambda_1$, then the reflected light wave $6'$ will emerge with the same phase as the reflected light wave $6$ so that there will be fully constructive interference. In equation form, the condition for constructive interference is given by:

$$\text{constructive interference: } 2d_1=m\lambda_1 \quad (2a)$$

where m is an integer. If twice the thickness $d_1$ of layer $14$ is equal to an integer multiple plus ½ of $\lambda_1$, then the reflected light wave $6'$ will emerge with the phase which is 180 degrees out of phase with the reflected light wave $6$ so that there will be fully destructive interference. In equation form, the condition for destructive interference is given by:

$$\text{destructive interference: } 2d_1=(m+½)\lambda_1 \quad (2b)$$

Substituting from Eq. (1), these conditions can be restated in terms of the optical thickness $D_1$ of layer $14$, where $D_1=d\cdot n_1$:

$$\text{constructive interference: } 2D_1=2d_1\cdot n_1=m\lambda_0 \quad (3a)$$

$$\text{destructive interference: } 2D_1=2d_1 n_1=(m+½)\lambda_0 \quad (3b)$$

Of course, in the actual case of an optical layer structure illuminated by panchromatic white light, there will be many levels of interference ranging from fully constructive to fully destructive which will vary as a function of wavelength. This is what produces the optically-detectable interference pattern with regions of different color light and intensity, as is seen, for example, on a soap bubble when viewed in white light.

In regions where the wavelength and thickness of the film produces an effective phase change close to 180 degrees (or odd multiples thereof), the reflected waves from the optical layer structure will interfere to cancel each other. Where the light wave passes through the optical layer structure and back with an effective phase change near 360 degrees (or even multiples of 180 degrees), the reflected waves from both surfaces of the dielectric layer will interact constructively and reinforce each other. Thus, when white light, which consists of a range of wavelengths, is incident on the optical layer structure, certain wavelengths (colors) are intensified while others are attenuated, producing a perceived color which will be a function of the geometry of the optical stack.

The mathematical details will change if $n_2<n_1$, or if the light is incident at an angle, or if the layer $15$ is transparent, or if additional layers are added. However, the principle of superposition of coherent light waves with a phase change due to the additional path length through a transparent layer resulting in light modulation due to constructive and destructive interference will apply to all the examples of interference described in this disclosure. The mathematical modeling of the spectral reflectance/transmittance characteristics of thin-film stacks is well-known in the field of optics, and the details of such analysis are not presented here. For example, see Chapter 8.2 of the book "The Physics of Thin Film Optical Spectra: An Introduction," by O. Stenzel (Springer-Verlag Berlin Heidelberg, Germany, 2005).

The thin-film layers in the optical layer structure of the present invention include the electrically-functional layers of the electrical element. In some exemplary embodiments, there are no additional layers of material added to those required for forming the electrical element, and no additional process steps are required to form the optical layer structure including the information-encoding pattern. This restriction is both practical and advantageous. It results in cost savings and process simplification if it is not necessary to perform additional layer deposition processes. As well be discussed below, the additional physical modulation of an existing functional layer to produce an optical layer structure requires no additional process steps or cost. However, despite these advantages, in some alternate embodiments it may be justified to add additional layers, or to modify the thickness of certain layers, in order to form an optically-detectable interference image having optical properties that are desirable for a particular application.

To better understand the present invention, we will first look at the exemplary types of thin-film electrical elements, and exemplary types of embedded information. Then we will address preferred methods of fabricating these structures. And finally, the methods of encoding and decoding the embedded information will be addressed.

SECTION I: THIN-FILM ELECTRICAL ELEMENTS

Electronic devices of the present invention include individual thin-film electrical elements. Transistors represent one exemplary type of useful electrical element. Transistors of the present invention include thin film transistors (TFTs) that are constructed of organic or inorganic thin films. Silicon transistors fabricated by selectively doping portions of a silicon wafer are also included within the scope of this invention, however for clarity of understanding the discussion will focus on TFTs.

The TFT structures described herein include a semiconductor channel, preferably an inorganic semiconductor, and more preferably a metal-oxide-based semiconductor. TFT structures also contain conducting electrodes, commonly referred to as a source and a drain, for injecting a current into the semiconductor, and a capacitively coupled gate for controlling and/or modulating the source-drain current. Preferred metal oxide based semiconductors include ZnO-based semiconductors. Examples of ZnO-based semiconductors are ZnO, InZnO (IZO), InO, and InGaZnO (IGZO, GIZO) and doped ZnO. ZnO-based semiconductors typically have a refractive index in the visible portion of the spectrum of around n=2.0.

Dielectrics useful for the present invention include organic and inorganic dielectric materials. Examples of inorganic dielectrics are $SiO_2$, HfO, ZrO, $SiN_x$, and $Al_2O_3$. Organic dielectric materials are preferably "polymer dielectrics," which are polymeric materials that can be used as an electrically insulating layer. It is useful to distinguish the polymer dielectric material from other polymeric materials or polymer layers that may be used in the device fabrication process. Polymer dielectrics of the present invention are preferably those that can be solution deposited, and are mechanically stable in the final application. Illustrative polymer dielectrics are polyimides, phenoxy resins, acrylic resin, epoxy resins, polyacrylates, polyvinyl phenol, polyvinyl pyrrolidone, organosiloxanes (such as PDMS) and the like, or their combinations and blends. The preferred polymer dielectrics are epoxy resins and polyimides. Polymer dielectric layers can be patterned using any method known in the art, including photopatterning, etching, additive printing (e.g., inkjet), flexography or gravure. In some instances, patterning of a polymer layer can be accomplished using a patterned inorganic thin film dielectric layer as a hard mask to etch a blanket-deposited polymer dielectric.

The substrates used in the present invention can be any material that acts as a mechanical support for the subsequently coated layers. Useful substrate materials include organic or inorganic materials. Examples of appropriate substrates can include rigid materials such as glass, silicon (with a dielectric barrier layer), or metals. Flexible substrates such as polymers (e.g., PET, PC, etc.) can also be used in the present invention. Nominally rigid materials that are flexible due to their thinness can also be used. These include glass at thicknesses below 200 μm, and metals at thicknesses below 500 μm. The substrate can be bare indicating that it contains no substantial materials on its surface other the material from which it is composed. Alternatively, the substrate can include various layers on its surface. These layers include subbing layers, adhesion layers, release layers, wetting layers, hydrophilic layers and hydrophobic layers. The substrate surface can be treated in order to promote various properties. These treatments include plasma treatments, corona discharge treatments, and chemical treatments.

The substrate can also include on its surface patterned materials. These patterns may include patterns that modulate light transmission or electrical conductivity within or on the substrate. The patterns can include complete devices, circuits, or active elements existing on the substrate. The patterns can also include portions of devices, circuits, or active elements awaiting subsequent processing steps for completion.

In general, electrical devices are built on a substrate such as silicon (with a dielectric barrier layer), glass, or polymers (e.g., PET, PC, etc.) that is insulating and optionally transparent. On the substrate, various patterned layers are deposited to form the electrical device. The patterned layers include conductive layers, very often using a transparent conductive oxide (TCO), such as AZO, dielectric layers and semi-conductive layers. Generally, it should be clear that each of these layers is considered to be electrically active, as each has a specific electrical function and collectively they are used to construct various electrical components of the present invention.

Figure 2A:
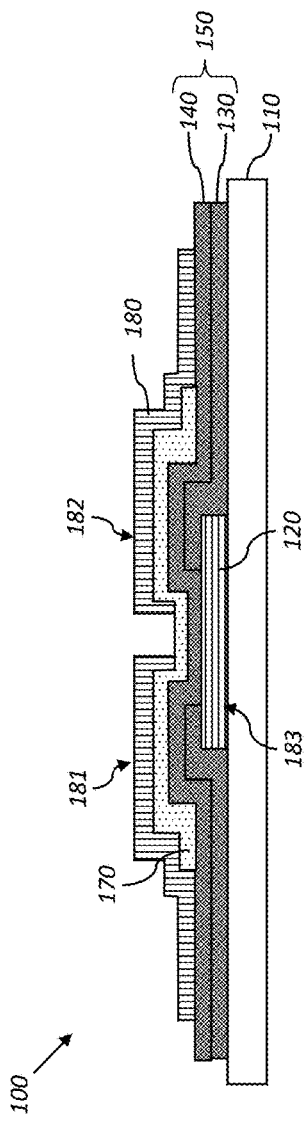
FIGS. 2A and 2B are cross-sectional views and plan views, respectively, illustrating an exemplary bottom-gate thin-film transistor.
Figure 2B:
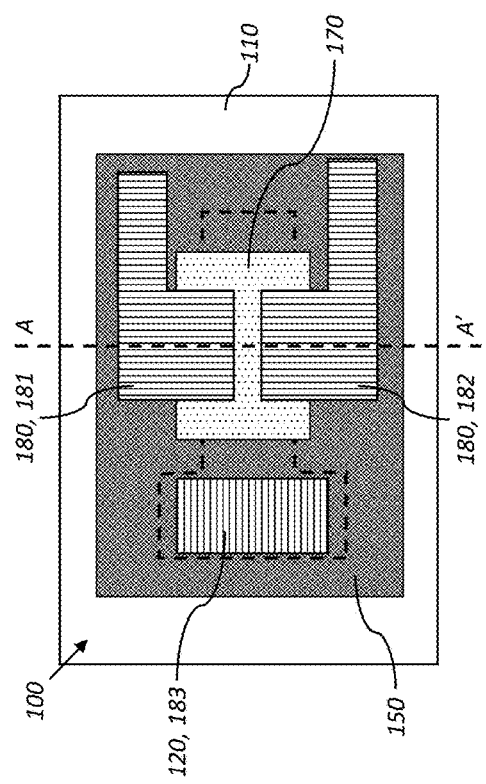

FIGS. 2A-2B illustrate an exemplary bottom gate thin-film transistor (TFT) 100, that was previously described in commonly assigned U.S. Patent Application Publication 2016/0126344 to Ellinger et al., entitled "TFT substrate with variable dielectric thickness," which is incorporated herein by reference. FIG. 2B shows a top view of the TFT 100, and FIG. 2A shows a cross-sectional side view taken through the line A-A'. The exact design of this TFT is not germane to this invention but is described in some detail to provide some specificity. As will be discussed later, the functional layers of the TFT 100 are preferably formed using selective deposition processes. However, in accordance with the present invention TFT 100 can be formed using any method known in the art.

For the purposes of understanding the present invention, the patterned thin-film layers in TFT 100 should be seen as representative of the layers used in a wide range of multi-layer thin-film devices including capacitors, diodes, resistors, conductive traces, and others. Accordingly, the addition of optical layer structures could apply to any such types of electrical devices. The thin-film layers used to form the TFT 100 are built up over a substrate 110. The substrate 110 can be fully insulating, or can be an otherwise conductive support such as a metal foil with an insulating material layer between the conductive support and the layers of the TFT 100.

The bottom layer is a first patterned conductive layer 120 that forms the bottom gate of the TFT 100. The next layer is a patterned dielectric layer, which as shown is a dual layer of inorganic dielectric material including a first patterned dielectric layer 130 and a second patterned dielectric layer 140. Collectively they can be referred to simply as a patterned dielectric stack 150. As illustrated, the pattered dielectric stack 150 has regions of differing thickness within the region of the TFT 100. In other embodiments, the patterned dielectric stack 150 can have a uniform thickness within the patterned area of the TFT 100. On top of those layers there is a patterned semiconductor layer 170. The patterned semiconductor layer 170 is in contact with a second patterned conductive layer 180, which optionally can be a formed with a transparent material such as a transparent conductive oxide (TCO) (e.g., AZO). The second patterned conductive layer 180 forms the source 181 and drain 182 for the TFT 100. (The designation of which electrode is the source 181 and which is the drain 182 is arbitrary.)

Figure 3A:
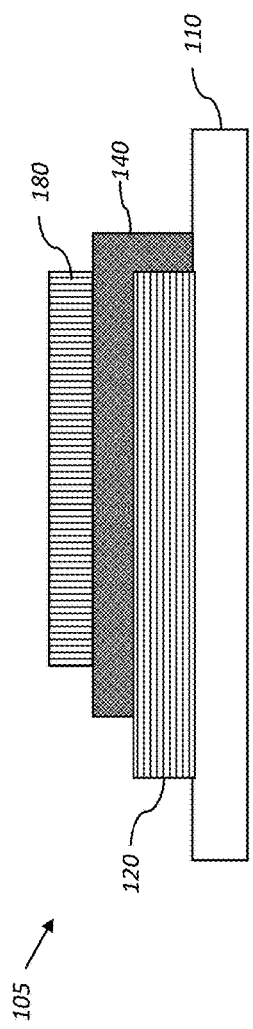
FIGS. 3A and 3B are cross-sectional views and plan views, respectively, illustrating an exemplary thin-film capacitor.
Figure 3B:
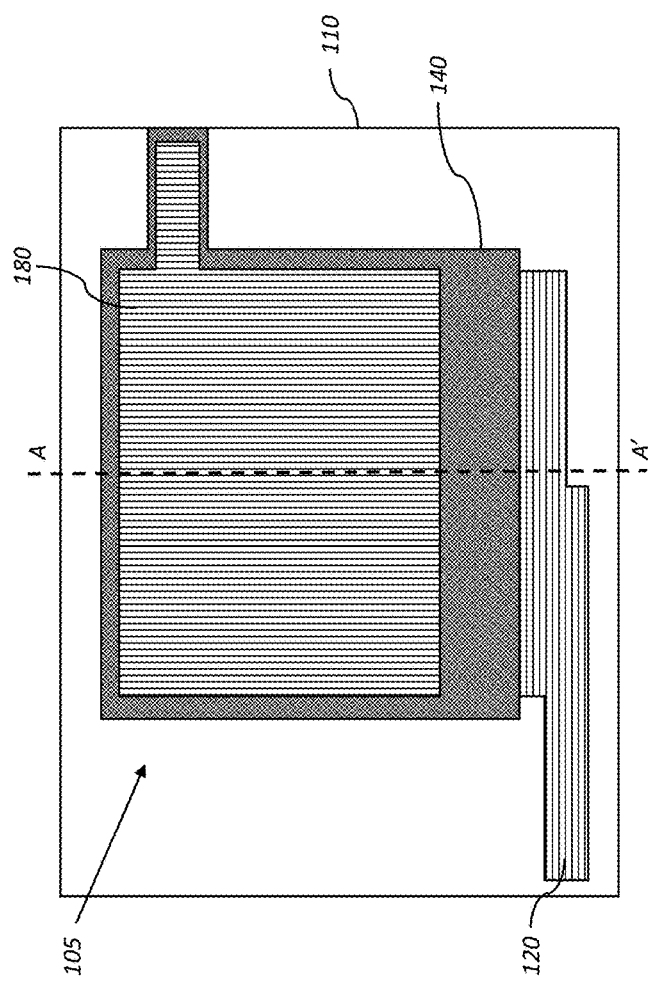

FIGS. 3A and 3B illustrate a top view and a cross-sectional side view of a thin-film capacitor 105, respectively, which is an example of a much simpler thin-film electrical device. As illustrated, the capacitor 105 is formed on a substrate 110. The bottom layer is a first patterned conductive layer 120, which forms the bottom electrode of the capacitor 105. A patterned conformal dielectric layer 140 is provided over the bottom electrode. A second patterned conductive layer 180 is provided over the top of dielectric layer 140, which forms the top electrode of the capacitor 105.

FIGS. 2A-2B and 3A-3B represent examples of electrical elements that can be made by stacking patterned thin-film layers of different materials (e.g., conductors, semiconductors and dielectrics) at different thickness and locations. Those skilled in the art will recognize that a wide variety of other types of electrical elements can similarly be formed using similar thin-film designs. This combination of layers plus patterns, both in the lateral plane as well as the thickness direction, results in a functional layer structure to form the electrical elements. An important insight for the present invention is that these same layers can also be patterned to provide optical effects in order to embed a pattern of information as an optically-detectable interference image. The optically-detectable interference image can be used for various purposes such as for identifying genuine articles. When the layers are physically patterned in this way for optical effects, it results in an optical layer structure. The optical layer structures are preferably made from the same layers as the functional layer structures. In some configurations, the optical layer structure patterns can be independent of the functional layer structure; that is, they can be placed alongside of, or on top of, the functional layer structure in such a way as to not affect the electrical properties. Alternatively, the optical layer structure patterns can be an integral part of the functional layer structure, such that the electrical properties are in part determined by structural patterns that are producing optical image patterns.

Figure 4:
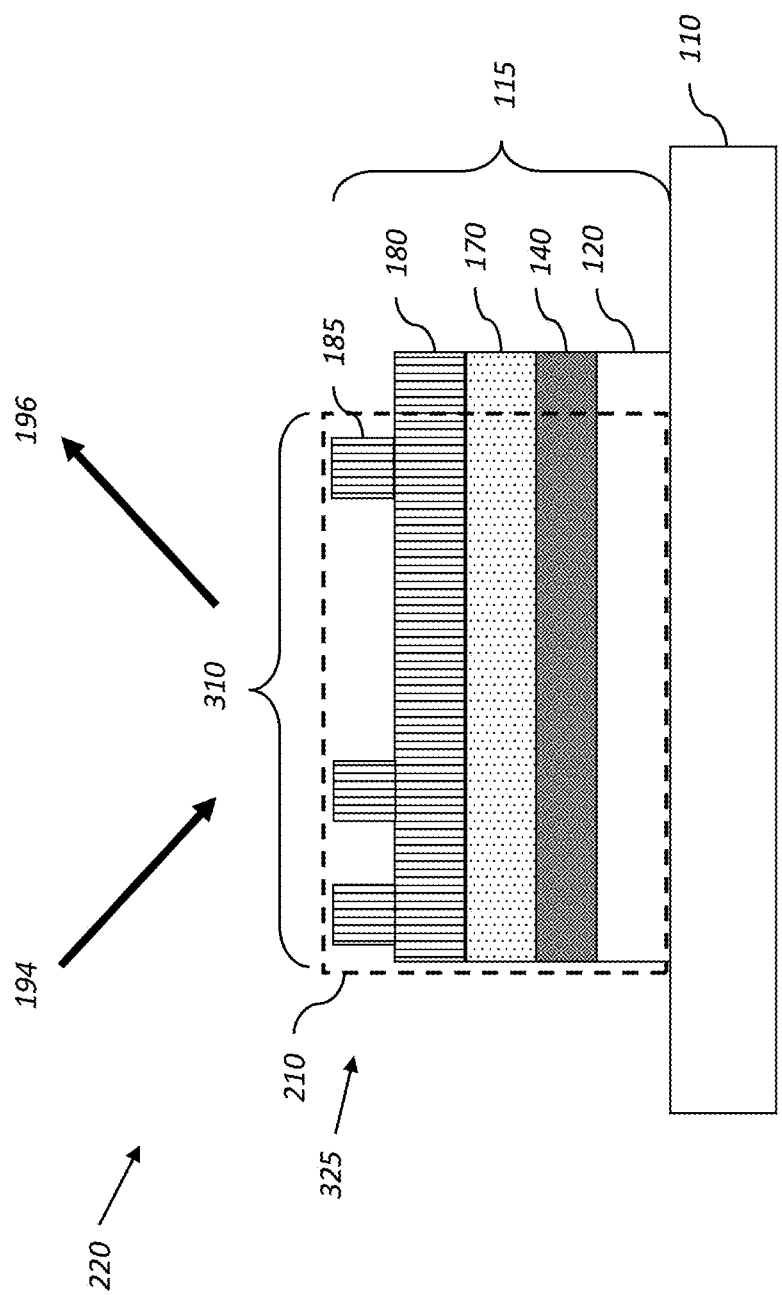
FIG. 4 illustrates the formation of an optically-detectable interference image by incorporating an information-encoding pattern into an additional layer added to the top of a thin-film stack.

FIG. 4 shows a set of thin film layers 115 which form an optical layer structure 210 in an encoding region 310 of an electrical element 220. In embodiments of the present invention, at least one layer in the optical layer structure 210 includes an information-encoding pattern 325. In this example, transparent conductive layer 185 includes a spatially-varying information-encoding pattern 325 (i.e., an x-y pattern) in the encoding region 310. The design of the x-y pattern used for the transparent conductive layer 185, together with the thicknesses and optical characteristics of each of the thin-film layers 115 results in the optical layer structure 210 having information that is encoded such that it will produce an optically-delectable interference image 196 when illuminated by incident light 194. Note that, in this example, the choice was made to provide an additional patterned transparent conductive layer 185 over the transparent conductive layer 180. The two upper conductive layers 180, 185 will effectively function as a single conductive layer. In the illustrated configuration, the optical layer structure 210 includes first and second partially-transparent layers of the same material (i.e., conductive layers 180, 185), wherein one of the partially-transparent layer (i.e., conductive layer 185) includes an information-encoding pattern 325 and the other partially-transparent layer (i.e., conductive layer 180) is in contact with the first partially-transparent layer. In some embodiments, an information-encoding pattern 325 can also be incorporated into a reflective layer.

When the optical layer structure 210 is illuminated by incident light 194 from a light source (not shown), thin-film interference is produced as the incident light waves interact with the thin film layers 115 in the optical layer structure 210, thereby forming an optically-detectable interference image 196. In some configurations, one or more of the layers (e.g., conductive layer 120 or substrate 110) may be reflective. In such cases, the interference image 196 will be formed by the transparent layers (e.g., dielectric layer 140, semiconductor layer 170 and conductive layers 180, 185) that are above the uppermost reflective layer (e.g., conductive layer 120). In other configurations, all of the layers may be transparent such that they all participate in forming the interference image 196. In such cases, interference images 196 can be observed in both the reflected and transmitted light beams.

In the specific x-y locations where material is present in the patterned conductive layer 185, the thickness produces an effective phase change of the light wave that will differ from the phase of the light wave passing through the other locations where no material is present in the conductive layer 185. This will produce a corresponding change in the spectral characteristics of the light in the resulting interference image 196. For example, when the incident light 194 is white light, which consists of a range of wavelengths, certain wavelengths (colors) corresponding to the interference conditions discussed above are intensified while others are attenuated such that the optically-detectable interference image-pattern 196 has spatially-varying spectral characteristics (i.e., colors).

Figure 5:
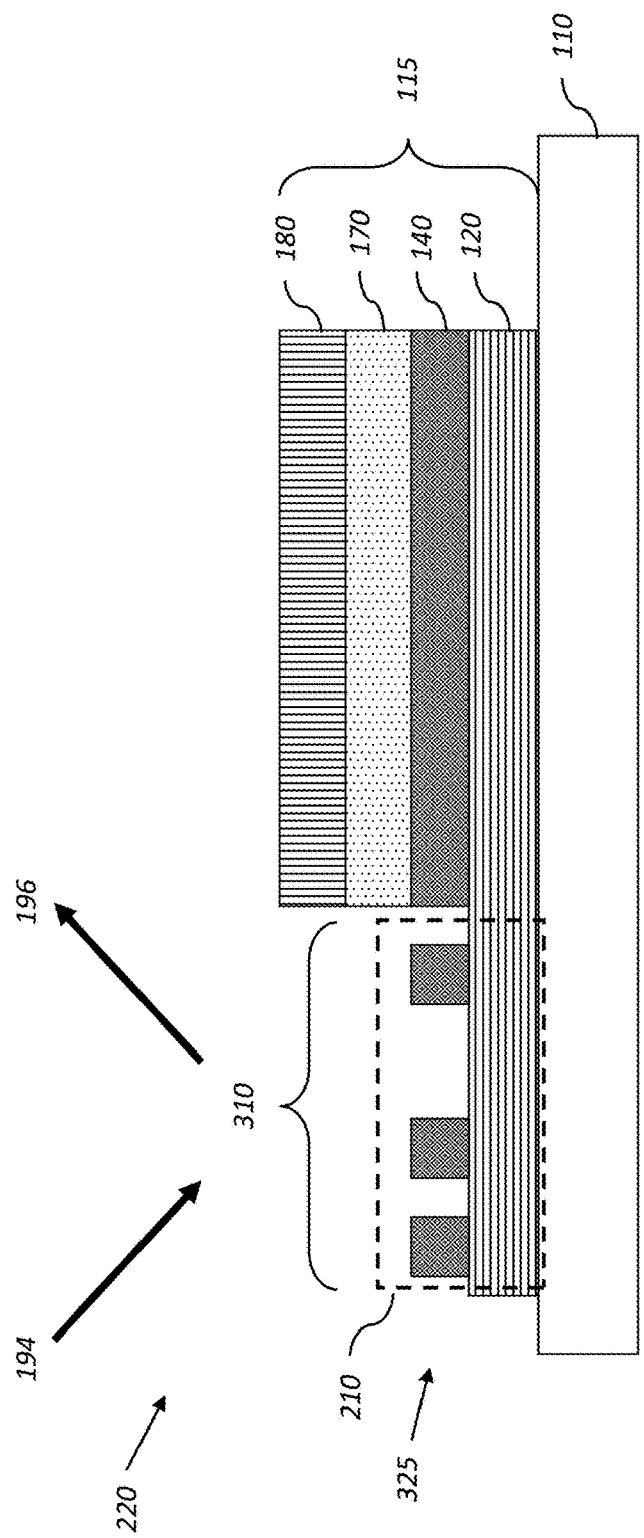
FIG. 5 illustrates the formation of an optically-detectable interference image by incorporating an information-encoding pattern into an existing layer of a thin-film stack.

FIG. 5 shows another example of a set of thin-film layers 115 on a substrate 110 which are used to form an electrical element 220. The set of thin-film layers 115 is also used to form an optical layer structure 210 in an encoding region 310. In the illustrated example, the optical layer structure 210 includes the conductive layer 120 and the dielectric layer 140, where the dielectric layer 140 has been patterned with an information-encoding pattern 325. When the optical layer structure 210 is illuminated by incident light 194 from a light source (not shown), thin-film interference is produced as the incident light waves interact with the thin-film layers 115 in the optical layer structure 210, thereby forming an optically-delectable interference image 196 in the encoding region 310. The spatially-varying spectral characteristics of the interference image 196 can be controlled by defining the information-encoding pattern 325 and selecting the thicknesses and optical characteristics (e.g., index of refraction and transparency/reflectivity) of the layers in the optical layer structure 210. In the example of FIG. 5, the layers used to form the optical layer structure 210 are a subset of the thin-film layers 115 that are used to form the functional layer structure of an electrical element (not shown).

An advantage of the configuration shown in FIG. 5 is that it is not necessary to add additional complexity or processing steps to generate the optical layer structure 210 along with the electrical element. Stated another way, one or more of the existing electrically-functional thin-film layers 115 are patterned with an information-encoding pattern 325 in an encoding region 310 to encode embedded information in the form of an optically-detectable interference image 196. The information-encoding patterns 325 can be formed simultaneously with the electrical element by whatever fabrication process is used to form the electrical element, including subtractive or additive patterning, or combinations of techniques.

One patterning technique that is useful in many applications is selective area deposition due to the orthogonal nature of the technique. In selective area deposition, an inhibitor is patterned, either subtractively or additively, in an inverse of the desired pattern, and an inorganic thin film is selectively deposited in the regions where the inhibitor is absent. Typically, the patterned inhibitor is a polymeric material deposited from solvent that does not interact with the substrate surface. Since organic materials are generally patterned over inorganic materials, the patterning of the inhibitor does not impact the underlying layers on the substrate—making the process "orthogonal." In contrast, typical subtractive patterning requires etch selectivity, and all-organic systems require the use of orthogonal solvents (i.e., overlayers are applied from solutions that do not dissolve or otherwise disturb the organic surface they are printed on). By simply varying the pattern of inhibitors before each of the thin-film layers 115 is deposited, optical image structures 210 are formed in the encoding region 310 simultaneously with the formation of the electrical element.

Figure 6A:
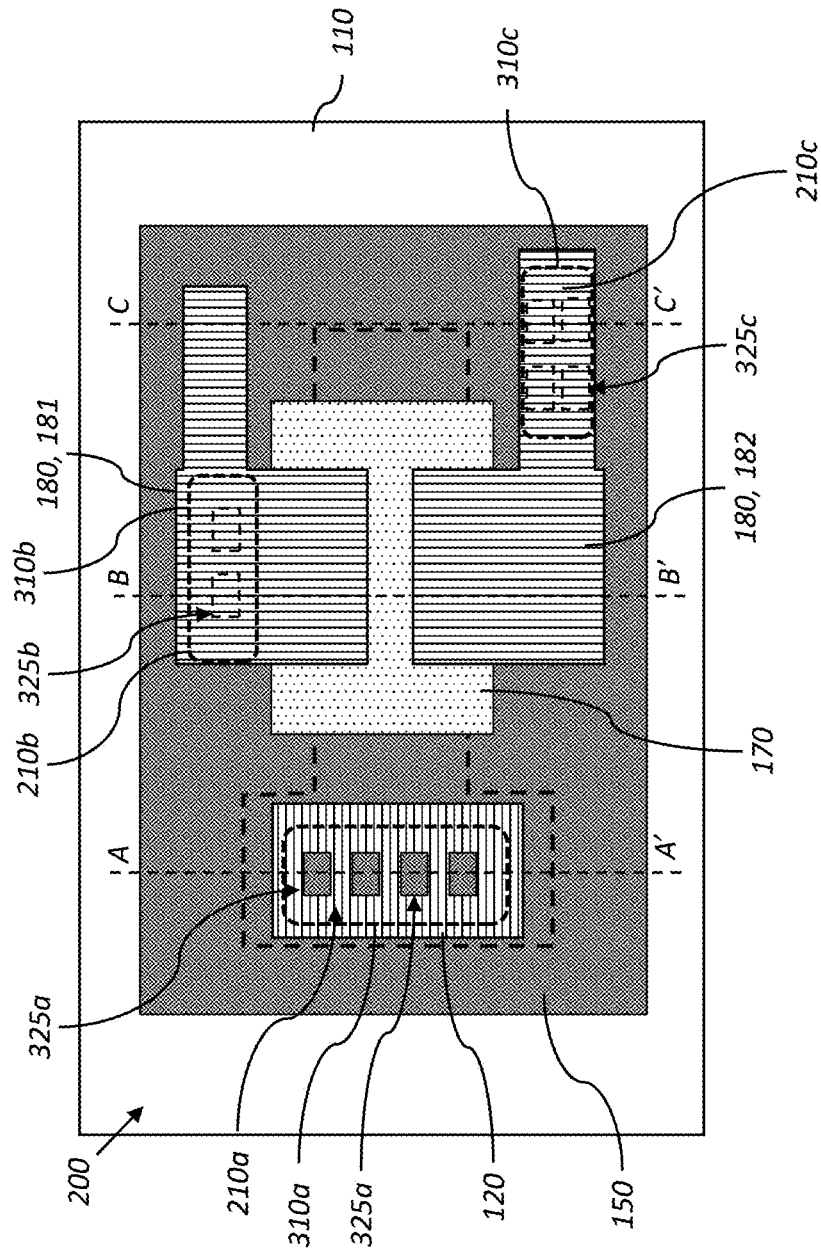

FIGS. 6A-6D show plan and cross-sectional views of an electrical device, in this case a TFT 200 similar to the TFT 100 of FIGS. 2A-2B. The electrical device includes three exemplary optical layer structures 210a, 210b, 210c, formed in respective encoding regions 310a, 310b, 310c. Each of the optical layer structures 210a, 210b, 210c includes an information-encoding pattern 325a, 325b, 325c formed into one of the layers. FIG. 6B shows a cross-section through the encoding region 310a taken through cut-line A-A'. FIG. 6C shows a cross-section through the encoding region 310b taken through cut-line B-B'. FIG. 6D shows a cross-section through the encoding region 310c taken through cut-line C-C'.

The optical layer structure 210a, shown in FIGS. 6A and 6B, is formed by patterning the dielectric layer 140 in the encoding region 310a to form the information-encoding pattern 325a on top of the first conductive layer 120. The optical layer structure 210a includes the dielectric layer 140, the first conductive layer 120, and the substrate 110. The information encoded in optical layer structure 210a is determined by the information-encoding pattern 325a provided in the dielectric layer 140.

The optical layer structure 210b, shown in FIGS. 6A and 6C, is formed by patterning the first conductive layer 120 in the encoding region 310b according to the information-encoding pattern 325b. In this case, the portions of the first conductive layer 120 that have the information-encoding pattern 325b are not electrically connected to the gate electrode 183 that is also formed in the first conductive layer 120. The optical layer structure 210b includes the second conductive layer 180, the dielectric stack 150, the first conductive layer 120, and the substrate 110. The information encoded in optical layer structure 210b is determined by the information-encoding pattern 325b provided in the first conductive layer 120.

The optical layer structure 210c, shown in FIGS. 6A and 6D, is formed by patterning the semiconductor layer 170 in the encoding region 310c according to the information-encoding pattern 325c, which is formed below the second conductive layer 120. The optical layer structure 210c includes the second conductive layer 180, the semiconductor layer 170, the dielectric stack 150, and the substrate 110. The information encoded in optical layer structure 210c is determined by the information-encoding pattern 325c provided in the first semiconductor layer 170.

Figure 7A:
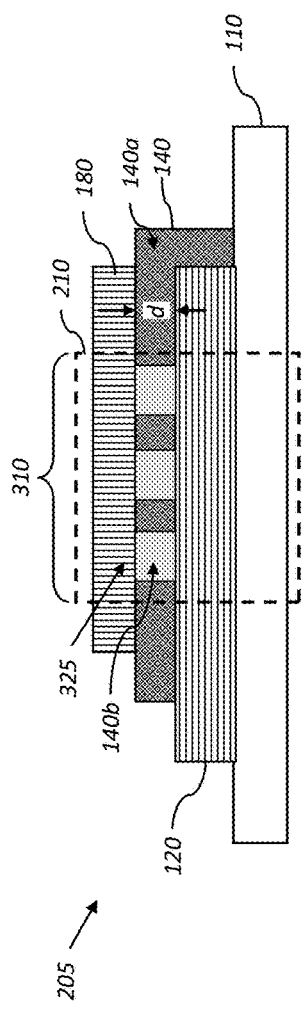
FIGS. 7A-7B illustrate a thin-film capacitor having an embedded information encoding pattern formed by incorporating two different dielectric materials in the dielectric layer.
Figure 7B:
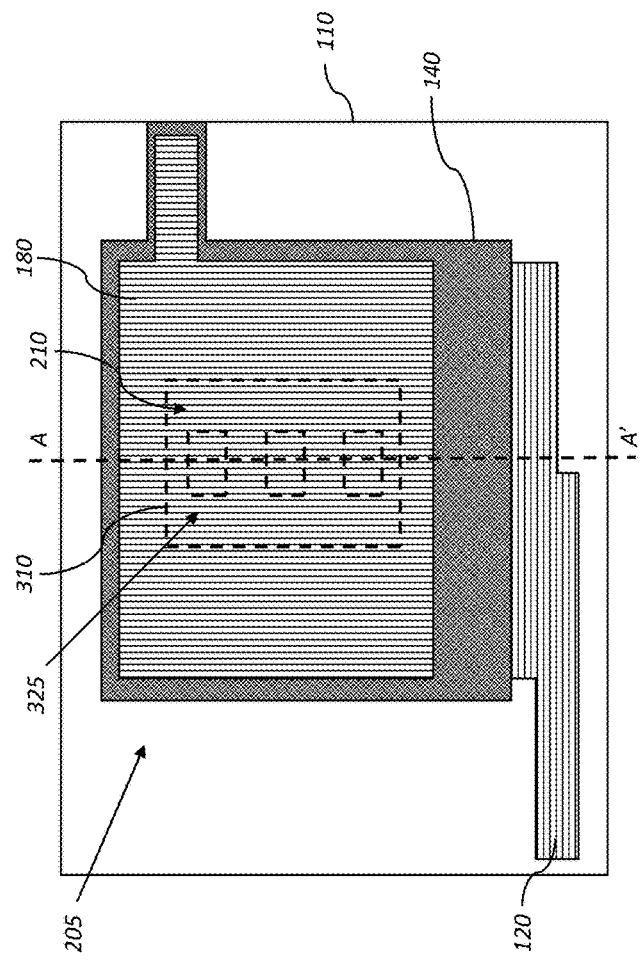

FIGS. 7A-7B show plan and cross-sectional views of an electrical device, in this case a capacitor 205 similar to the capacitor 105 of FIGS. 3A-3B. The capacitor 205 includes an exemplary optical layer structure 210 formed in an encoding region 310. The optical layer structure 210 includes an information-encoding pattern 325 formed into the dielectric layer 140. In this case, the dielectric layer 140 is composed of two different dielectric materials 140a, 140b with different optical properties. By careful selection of the index of refraction of the dielectric materials 140a, 140b, an optically-detectable interference image can be formed in the encoding region 310. In the illustrated configuration, the physical thickness d of the two dielectric materials 140a, 140b in the optical layer structure 210 is the same. However, as discussed earlier the interference characteristics are related to the optical thickness (D=d·n) of the layers in the optical layer structure. Therefore, an optically-detectable interference image can be formed if the refractive indices for dielectric materials 140a, 140b differ sufficiently to create spectral contrast from the change in their optical thickness. In contrast to the optical layer structures 210 shown in FIGS. 4 and 5, the exposed upper layer (i.e., conductive layer 180) is of uniform thickness and has no indicia printed on it. Instead, the modulated layer (i.e., dielectric layer 140) is buried below the top layer (i.e., it is not the top layer), making this method particularly difficult to counterfeit.

FIGS. 8A-8B illustrate another arrangement for fabricating a capacitor 205 having an optical layer structure 210 in an encoding region 310 which includes an information-encoding pattern 325. In this case, the information-encoding pattern 325 is formed by varying the thickness of the dielectric layer 140. This can be done by selective deposition and removal of the coating inhibitor as described later. After the dielectric layer 140 is formed with varying thicknesses in the encoding region 310, the second conductive layer 180 is conformably deposited over the dielectric layer 140. In contrast to the optical layer structures 210 shown in FIGS. 4 and 5, the exposed upper layer (i.e., the dielectric layer 140) is of uniform thickness and has no indicia printed on it. Instead, the modulated layer is buried below the top layer, making this method particularly difficult to counterfeit. By appropriate selection of the thicknesses of the dielectric layer 140, an optically-detectable interference image can be formed in the encoding region 310.

It is important to note that in various embodiments, optical layer structures 210 of the present invention can be formed in the encoding region 310 by incorporating an information-encoding pattern 325 into any of the thin-film layers 115 used to fabricate the electrical device. In some configurations, an information encoding pattern 325 is incorporated into only one thin-film layer. In other configurations, information-encoding patterns 325 are incorporated into a plurality of the layers. The substrate 110 can be a clear material, such as glass, or can be an opaque reflective material which provides a reflective surface for interference purposes. For optical layer structures 210 using the exemplary set of layers shown in the preceding figures, the first conductive layer 120 can be reflective or transparent, and can have its pattern and thickness modulated. Similarly, the dielectric layer 140 and the semi-conductive layer 170 can be patterned, can have varying thickness, or can be made reflective or transmissive by the choice of appropriate materials.

SECTION II: ELECTRICAL ELEMENT FABRICATION METHODS

Figure 9:
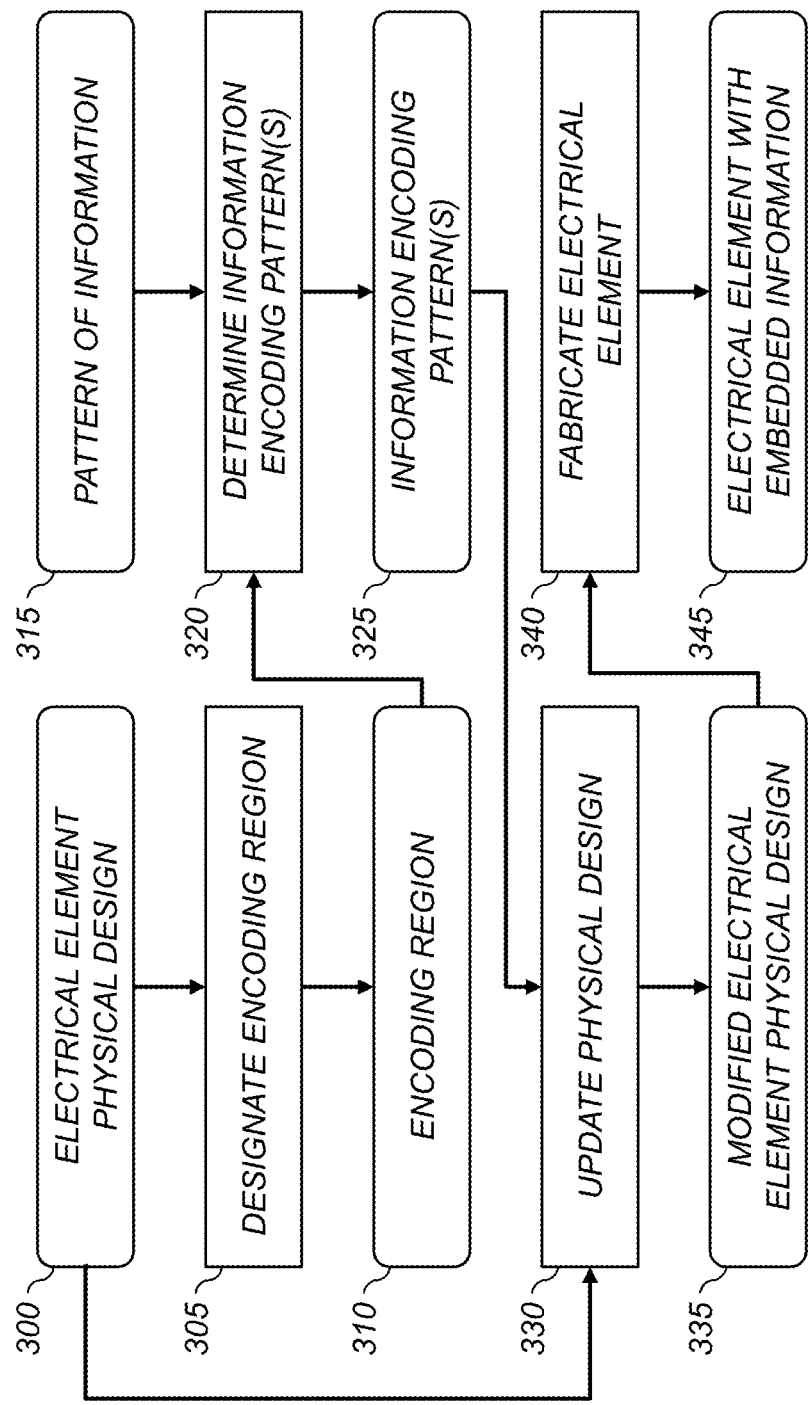
FIG. 9 is a flow chart showing an exemplary method for fabricating an electrical element with embedded information.

FIG. 9 shows a flow chart for a method of fabricating an electrical element with embedded information 345, where the embedded information is in the form of an optical layer structure having an information-encoding pattern which contributes to an optically-detectable interference image. The electrical element can be any thin-film electrical component such as a transistor, capacitor, resistor, diode or conductive trace. The electrical element can also be a complete or partial electrical circuit including a plurality of individual thin-film electrical components.

Figure 10:
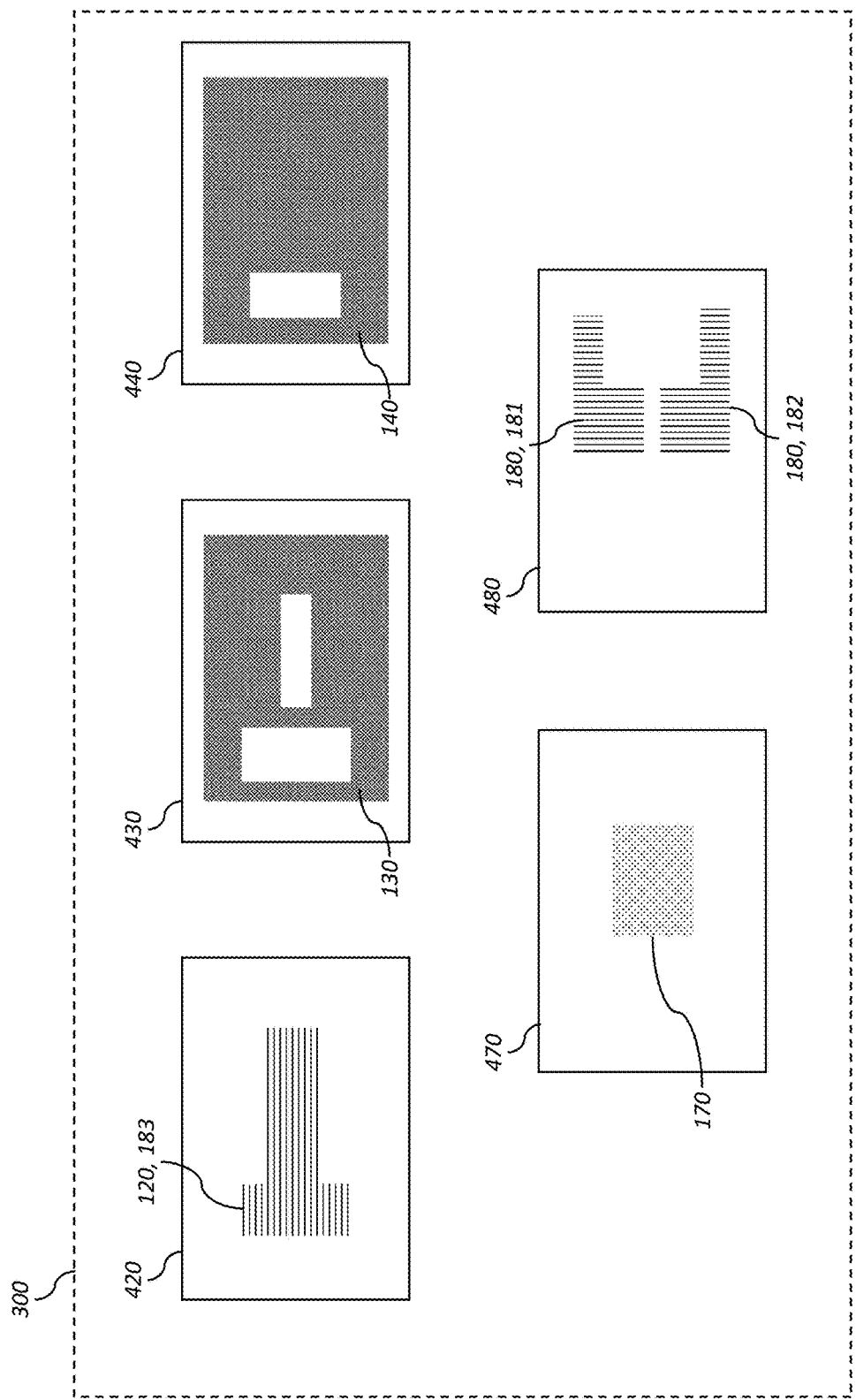
FIG. 10 illustrates an electrical element physical design for an exemplary bottom-gate thin-film transistor.

An input to the method is an electrical element physical design 300 for a thin-film electrical element that is useful to perform an intended electrical function. The electrical element physical design 300 includes the x,y pattern dimensions and thickness information for a plurality of thin-film layers corresponding to the desired physical electrical element fabricated with thin-film materials. The physical design can be considered to be a design file or layout which includes the material layer thickness information, and can optionally include any corrections necessary to accommodate offsets between the desired as-fabricated structures and the design due to the impact of known process off-sets. For example, FIG. 10 illustrates an electrical element physical design 300 for a thin-film transistor (TFT) similar to that shown in FIGS. 2A-2B. A first conductive layer pattern 420 is used to fabricate the first conductive layer 120 to form the gate electrode 183; a first dielectric layer pattern 430 is used to fabricate the first dielectric layer 130; a second dielectric layer pattern 440 is used to fabricate the second dielectric layer 140; a semiconductor layer pattern 470 is used to fabricate the semiconductor layer 170; and a second conductive layer pattern 480 is used to fabricate the second conductive layer 180 to provide the source 181 and drain 182 electrodes. In addition to the set of physical patterns, the electrical element physical design 300 also specifies a substrate material and the materials that should be used to fabricate each of the layers, together with the layer thickness. In an exemplary configuration, the first conductive layer 120 is a 100 nm thick layer of aluminum-doped zinc oxide or aluminum; the first dielectric layer 130 is a 25 nm thick layer of alumina; the second dielectric layer 140 is a 25 nm thick layer of alumina; the semiconductor layer 170 is a 20 nm thick layer of zinc oxide; and the second conductive layer 100 nm thick layer of aluminum-doped zinc oxide.

Another input to the method of FIG. 9 is a pattern of information 315 that is to be embedded in the electrical element. The pattern of information 315 can include elements such as text characters, graphical elements, bar code patterns, or photographic images. In some cases, the pattern of information can be binary patterns having two image states. In other cases, the pattern of information can be multi-level patterns having more than two image states. For example, a multi-level pattern can have a plurality of image states, where each image state has a different image color associated with it. In an exemplary embodiment, the pattern of information 315 can be specified as an x-y array of pixels providing a bitmap of the pattern to be encoded in the electrical element.

A designate encoding region step 305 is used to designate an encoding region 310 within the electrical element physical design 300 where the pattern of information 315 is to be embedded. In some configurations, such as those discussed earlier with respect to FIGS. 6A-6D, the encoding region 310 can be positioned in a location where the embedded information will not affect the electrical function of the electrical element. However, as was discussed earlier with respect to FIGS. 7A-7B, in other configurations it may be desirable to embed the pattern of information 315 in a location where it will affect the electrical function of the electrical element.

Figure 11:
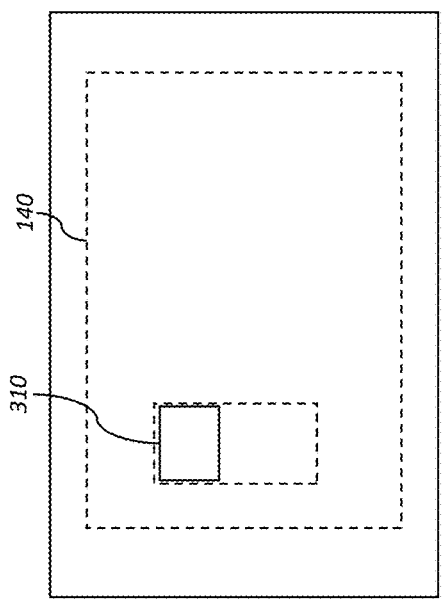
FIG. 11 illustrates an encoding region designated within the electrical element physical design of FIG. 10.

FIG. 11 shows an exemplary encoding region 310 located within an opening in the second dielectric layer 140 so that it is positioned within an exposed portion of the gate electrode 183 (see FIG. 2B). Other examples of encoding regions 310 were shown earlier in FIGS. 4-8.

Figure 12:
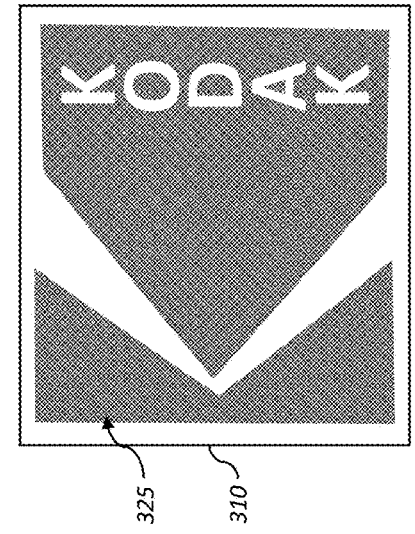
FIG. 12 illustrates an exemplary pattern of information to be embedded in the encoding region of FIG. 11.

Returning to a discussion of FIG. 9, a determine information encoding pattern(s) step 320 is next used to determine one or more information encoding pattern(s) 325 to be inserted into corresponding thin-film layers of the electrical element physical design 300 in order to encode the pattern of information 315 in the encoding region 310. For example, if the pattern of information 315 corresponds to a binary Kodak logo, an information encoding pattern 325 corresponding to a bitmap of the logo can be defined within the encoding region 310 as shown in FIG. 12.

Figure 13:
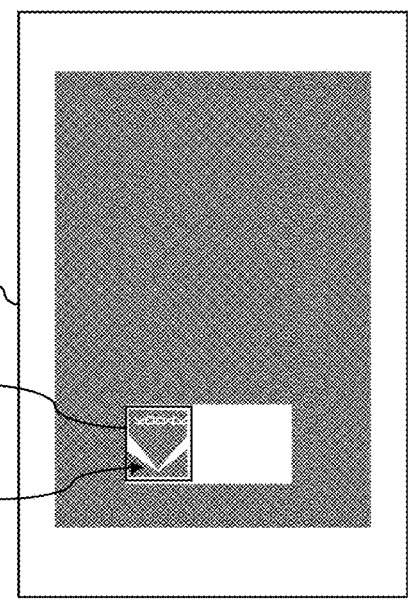
FIG. 13 illustrates a modified thin-film layer pattern including an information encoding pattern corresponding to the pattern of information of FIG. 12.

An update physical design step 330 is used to insert the determined information encoding pattern(s) 325 into one or more of the thin-film layers in the electrical element physical design 300 to determine a modified electrical element physical design 335. For example, FIG. 13 illustrates an exemplary configuration where the original dielectric layer pattern 440 shown in FIG. 10 is modified to insert the information encoding pattern 325 of FIG. 12 within the encoding region 310 to provide a modified dielectric layer patter 445.

Examples of other types of information encoding patterns 325 are shown in FIGS. 14A-14E. FIG. 14A illustrates an information encoding pattern 325 corresponding to a pattern of text characters (in this case the text characters give a company name and a part number for the electrical element). FIGS. 14B and 14C illustrate information encoding patterns corresponding to patterns of binary graphical elements. The information encoding pattern 325 of FIG. 14B corresponds to a bar code, which can be used to encode information such as a part number for the electrical element. The information encoding pattern 325 of FIG. 14C corresponds to a "QR Code" which is a well-known type of two-dimensional bar code. The QR Code can be used to access information about the electrical element. For example, the QR Code can encode a URL for a product web page giving technical information about the electrical element. FIG. 14D illustrates an information encoding pattern 325 corresponding to a photographic image. In this case, the photographic image is a binary halftone image having two image states (i.e., "dark" and "light").

The information encoding patterns 325 shown in FIGS. 14A-14D are all binary patterns having two image states. Such patterns can be produced by modifying a single thin-film layer of the electrical element physical design 300. In some embodiments, the pattern of information 315 to be encoded in the electrical element can have more than two image states. For example, the pattern of information 315 could be specified as a color graphical element having regions of different colors. For example, FIG. 14E shows a pattern of information 315 corresponding to a color logo. The logo includes first color regions 316 having a first color (e.g., yellow) and second color regions 317 having a second color (e.g., red).

To provide embedded information having more than two states, it is necessary to insert information encoding patterns 325 into more than one of the thin-film layers in the optical layer structure. The number of different colors that can be provided in the optically-detectable interference image will depend on the number of thin-film layers that are modified to insert information encoding patterns 325. In general, when the thin-film layers are modified using binary information encoding patterns 325 it can be shown that the number of possible color states $N_C$ (i.e., the number of image states) in the optically-detectable interference image will be given by:

$$N_C = 2^{(N_L)} \qquad (4)$$

where $N_L$ is the number of thin-film layers that include binary information encoding patterns 325. For example, if three thin-film layers in the electrical element physical design 300 are available for inserting information encoding patterns 325, then $2^3=8$ different color states can be formed in the interference image. Each color state will correspond to different combinations of the binary states for each of the thin-film layers as shown in Table 1. In this table, a binary state of "1" for a particular layer indicates that the thin-film layer is present at a particular location, and a binary state of "0" indicates that the thin-film layer is not present.

TABLE 1

Color states for 3-layer interference images

| Color State | Layer 1 | Layer 2 | Layer 3 |
|---|---|---|---|
| 1 | 0 | 0 | 0 |
| 2 | 0 | 0 | 1 |
| 3 | 0 | 1 | 0 |
| 4 | 0 | 1 | 1 |
| 5 | 1 | 0 | 0 |
| 6 | 1 | 0 | 1 |
| 7 | 1 | 1 | 0 |
| 8 | 1 | 1 | 1 |

FIGS. 15A-15C show exemplary inhibitor patterns 605, 610 and 615 that would be needed for coating steps used to form the three layers (e.g., first conductor layer 120, dielectric layer 140, and second conductive layer 180) to produce the eight available colors in the interference image. The colors are produced by illuminating thin-film stacks 622, 623, 624, 625, 626, 627, 628, 629 that are formed with the different combinations of thin-film layers. FIGS. 15D and 15E illustrate a plan view 620 and a cross-sectional view 630, respectively, of a resulting optical layer structure 310 including of the thin-film stacks 622-629 forming the 8 different colors. (Note that for thin-film stack 622, the thickness of the different layers is zero and surrounding edges are coated for clarity in the illustration.)

A significant process simplification results from eliminating any requirement to remove inhibitor material once it is deposited. FIGS. 16A-16C show the inhibitor patterns 705, 710 and 715 that are available for each coating step if removing inhibitor is not allowed. The resulting optical layer structure 310 with thin-film stacks 722, 723, 724, 725, 726, 727, 728, 729 is shown in the cross-sectional view 730 of FIG. 16D. In this case, the first four thin-film stacks 722-725 produce unique color states, with the remaining thin-film stacks 726-729 being redundant. Therefore, if this constraint is imposed a smaller number of color states will be achievable.

Thin-film stack modeling techniques that are well-known to those skilled in the art can be used to determine the color that will be produced for each of the available color states. Such models can be used to predict the spectral reflectance (or transmittance) of a thin-film stack having a set of layers having defined thicknesses and indices of refraction. (For example, see the aforementioned book "The Physics of Thin Film Optical Spectra: An Introduction.") Color values in a color space such as the well-known CIE L*a*b* color space can then be determined from the spectral reflectance/transmittance. Software is readily available which can be used to perform the calculations necessary to determine the spectral properties of a thin film stack given the thicknesses and optical properties of each of the layers. One such software tool is OpenFilters, which is an open source software application, released under the GNU General Public License, for the design of optical interference filters.

In an exemplary embodiment, the set of colors that can be made by modifying a defined set of thin-film layers in the electrical element physical design 300 are determined using an appropriate thin-film stack modeling technique. The colors in the specified pattern of information 315 to be encoded in the electrical element (e.g., the yellow and red colors of the first and second color regions 316, 317 of the pattern of information 315 of FIG. 14E) can then be compared to the set of available colors to select the most appropriate color states (e.g., the color states having CIE L*a*b* values closest to that of the desired colors). In the example of FIG. 14E, patterns of information 325a, 325b are determined for two of the thin-film layers (e.g., the dielectric layer 140 and the conductive layer 180).

In some embodiments, halftoning methods can be used to create the appearance of other colors that are intermediate to the set of $N_C$ color states. For example, a conventional binary halftoning process can be used to create intermediate tone levels between dark and light states as was shown in FIG. 14D. Similarly, a color halftoning process can be used to create intermediate colors between a set of color states. Any appropriate halftoning algorithm known in the art can be used for such applications. One type of halftoning algorithm that is known in the art that can be used to create color halftone images from an arbitrary set of color states is known as vector color error diffusion.

As mentioned earlier, in some embodiments information-encoding patterns can also be formed by varying the thickness of one or more of the layers in an optical stack. For example, the layer thickness can be varied by selective deposition and removal of a coating inhibitor in a process using the combination of selective area deposition (SAD) and atomic layer deposition (ALD) as described in commonly-assigned U.S. Patent Application 2016/0126344, incorporated herein by reference. The use of variable thickness layers can enable specific color states to be more accurately produced. For example, to produce the yellow color defining the letters and background for the first color regions 316 in FIG. 14E the thickness of one of the layers (e.g., the dielectric layer 140 including the information-encoding pattern 325a) can be adjusted so that the optical thickness $D=(m+\frac{1}{2})\lambda_{blue}$, the destructive interference condition for blue light. Under white light illumination, the reduction of the blue band will leave red and green wavelengths that together are perceived as yellow by the eye. In the red second color region 317, the thickness of another layer (e.g., the conductive layer 180 including the information-encoding pattern 325b) so that the optical thickness $D=(m+\frac{1}{2})\lambda_{green}$, the destructive interference condition for green light. Under white light illumination, the reduction of the blue band from the first layer thickness and the green band from the second layer thickness will leave only red wavelengths that are perceived as red by the eye in the locations where the two modified layers overlap.

Returning to a discussion of FIG. 9, once the modified electrical element physical design 335 has been determined, a fabricate electrical element process 340 is used to fabricate an electrical element with embedded information 345 in accordance with the modified electrical element physical design 335. The fabricate electrical element process 340 can use any process known in the art to fabricate the electrical element with embedded information 345.

In some embodiments, the thin film layers are deposited using ALD, more preferably using spatial ALD (SALD). An inorganic thin-film layer can be deposited uniformly and patterned using any method known in the art, including using a photolithographic process. Preferably, the inorganic thin-film layer can be patterned as deposited by using the combination of selective area deposition (SAD) and ALD. SAD employs a patterned material referred to as a "deposition inhibitor material" which inhibits the growth of a thin-film material on the substrate when the substrate is subjected to an ALD process.

The deposition of the deposition inhibitor material can be in a patterned manner, such as using inkjet, flexography, gravure printing, microcontact printing, offset lithography, patch coating, screen printing, or transfer from a donor sheet. In alternative embodiments, a uniform layer of the deposition inhibitor material can be deposited and then patterned to form a patterned layer of the deposition inhibitor material. The active inhibiting material may be suspended or dissolved in a solvent or vehicle.

In an exemplary embodiment, the fabricate electrical element process 340 uses thin-film fabrication processes such as those described in the aforementioned U.S. Patent Application Publication 2016/0126344 to Ellinger et al., which describes the details of process steps that can be used to create exemplary embodiments of the present invention using selective area deposition (SAD) in combination with SALD. SAD employs a patterned material referred to as an "inhibitor" that inhibits the growth of a thin-film material on the substrate when the substrate is subjected to an atomic layer deposition. The layer material only deposits in regions (selective areas) of the substrate where the inhibitor is not present. The inhibitor is used to create functional layer structures and optical layer structures in the thin-film layer stack. The same process can be used for both the functional and optical layer structures, the only difference being where the inhibitor is placed. In an exemplary embodiment, the process described in U.S. Patent Application Publication 2016/0126344 is applied repeatedly to build up the functional devices and image patterns.

There are a number of options for where to place optical layer structures 210 in electronic elements 220 (FIG. 4). The constraints and details will vary depending on the choices made. In some cases, electronic elements 220 with visual information can have independent image and electronic function or coupled image-electronic function. In cases where the optical layer structures 210 will impact the electrical function, this impact will need to be taken into account to deliver the desired performance.

Examples of electronic elements include conductive lines or pads, usually made from a patterned conductive layer; resistors, usually made from a combination of patterned conductive layers and semiconductor layers; capacitors, usually made from a stack of layers including conductive layers and dielectric layers; and TFTs and diodes, usually fabricated from a complex stack of layers including conductors, dielectrics and semiconductors.

Thus, the available layers for making functional and optical layer structures include the traditional building blocks for semiconductor devices, namely: conductors, semiconductors and dielectrics. In order to embed the information, the patterned layers need to have different optical properties as well as appropriate electrical properties. For the purposes of this discussion the optical properties of interest are within the visible spectrum of roughly 400-700 nm. Useful opaque conductors can be either absorptive or reflective, and can include appropriate materials known in the art, such as metals. Of particular interest are transparent materials, including metal oxides. Exemplary transparent conductors include ITO and AZO. The refractive index of thin film AZO is approximately 1.83 (in the visible region). Useful inorganic dielectrics include $SiO_2$ and $Al_2O_3$; refractive index of thin film alumina deposited via SALD is nominally 1.58. Polymer dielectrics, such as SU8, are also useful in the present invention, and often have dielectric constants around 1.6. A particularly useful semiconductor in ZnO, having a refractive index of approximate 1.93. Forming stacks of materials of different refractive indices form colored image content for embedded information as previously described.

Encoding regions 310 for optical layer structures can be placed in "free space" on a circuit substrate by adding layer structures with complete design freedom or can be placed over a bus line, data line, conductive trace or contact pad or between conductive elements. Options include varying the shape of functional vias or, if a bottom conductor, any upper layer can be patterned. Within the area of an element (e.g. a TFT or a capacitor) options include varying the shape of the semiconductor isolation, varying the dielectric thickness within a capacitor or changing the shape of the two electrodes of a capacitor (or diode, or any other two-terminal device).

Conductors are typically single material elements. Most lines have vias, and most circuits have multiple conductor (metal) levels. Conductive lines tend to have a large footprint relative to other circuit components, and multiple areas that could be independently addressed. In some embodiments of the present invention optical structures are located on conductors and do not affect the functional behavior since the conductor acts as a shield and optical layer structures placed on the surface of the conductor does not change the conductors' properties. For example, a conductive metal base with patterned AZO on lines has metal for conductive bus-bars, with AZO patterning for information contact in level of gate or SD of active devices. This could be placed over lines, pads, individual elements. A transparent conductive base or area with patterned metal such as an AZO pad/area with printed metal for information. In a variant, the pattern could also be chosen to reduce the overall sheet resistance, making is more of an active pattern functionally as well as optically. Yet another example is a conductive metal base with vias in a dielectric layer that is patterned to both be a conductive path and contain information.

Resistors are also typically a single material element, for example AZO or ZnO base with pattern of AZO or ZnO. Typically, the functional property of a thin film resistor is a bulk element property derived end-to-end. An additional deposition of AZO or ZnO to form an optical layer structure will create a pattern dependent property depending where on image resistance is tested. All interference. Resistors can also be made from a transparent conductive base or area with patterned metal. This is similar to the conductor example: The AZO pad or area is also patterned with printed metal for information. However, the pattern must be chosen to also provide the desired resistance. The actual foot print of the resistor can be chosen for information content.

Capacitors in their simplest embodiment are simply a conductor-insulator-conductor structure. Typically, capacitors are made with a metal-dielectric-metal layer stack. An optical layer pattern added to the conductor(s) has minimal impact on the device function, e.g. the measured capacitance, unless the conductor is resistive. When the optical encoding pattern content is in the dielectric, the capacitor will have an overall property which can be measured and is a result of the local properties and dielectric thicknesses. Capacitors tend to have a large footprint relative to other circuit components. For image content exclusively in either the top or bottom electrode, a conductive metal base with patterned AZO on lines or a transparent conductive base/area with patterned metal is used. The conductive metal base with vias in a dielectric layer can be patterned to be a conductive path and contain information. Note that the image content can be divided between the top and bottom electrode, depending on how many layers other devices on the substrate require. As discussed earlier, it is also possible to have image content in a multi-layer dielectric using either the same material with varying thickness or different materials. In the case of placing the image creating structure in the dielectric, the capacitance will be changed and local charge density variation will occur in the conductive layers. These variations will need to be accounted for in the functional design of the capacitor.

Thin-film transistors (TFTs) are conductor-insulator-semiconductor-conductor structures. The semiconductor is critical to the TFT performance and is not available for embedding image content within the channel region, but other areas of the device such as over reflective bus bars or under transparent conductors, as well as areas of the substrate between individual elements, are all useful locations for using the semiconductor layer for embedding information. For example, the semiconductor layer can be patterned over a conductive pad.

All the design considerations for the optical and functional layer structures discussed above for conductors may be applied to the gate, source and drain of the TFT—although the accessible area will be smaller than for conductive lines, resistors or capacitors. Circuits could also be designed with image content in mind—essential a layout fingerprint that could be digitally varied for ID. Diodes can also be conductor-insulator-semiconductor-conductor structures or just conductor-insulator-conductor structures. The active diode area tends to be small, and it is likely that content would need to be in peripheral elements or conductive traces, although some other options may exist.

SECTION III: DETECTION OF EMBEDDED INFORMATION-ENCODING PATTERNS

Figure 17:
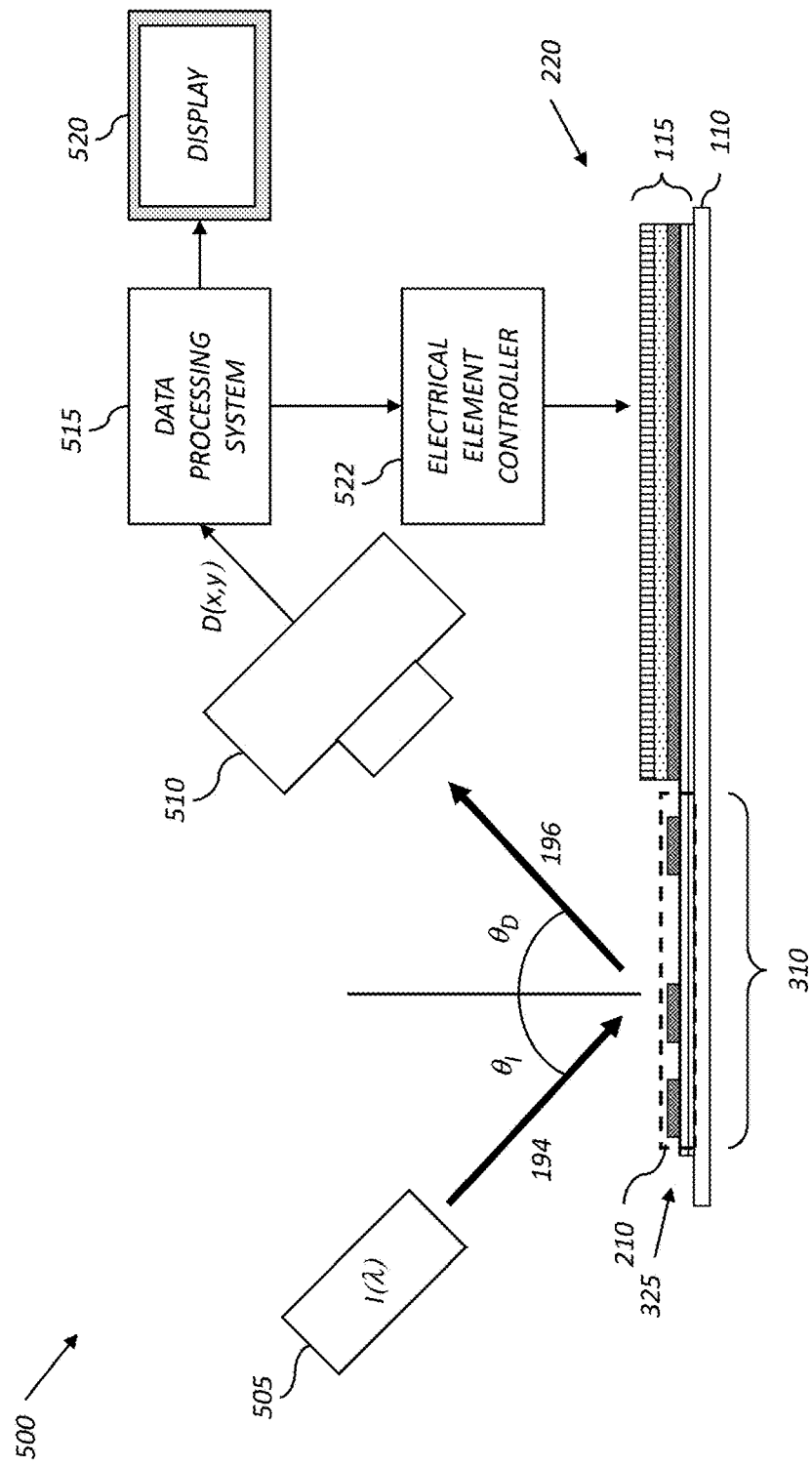
FIG. 17 illustrates an exemplary pattern detection system for decoding patterns of information encoded in a thin-film electrical element as an optically-detectable interference image.

FIG. 17 illustrates an exemplary pattern detection system 500 that can be used to detect optically-detectable interference images 196 formed in an encoding region 310 of an electrical element 220 in accordance with the present invention. Typically, the size of the electrical elements 220 are very small, on the order of micrometers to millimeters. Typically, the size of the information encoding patterns 325 such as text characters graphical elements and computer readable bar or QR codes will also be in the range of micrometers to millimeters. Thus, viewing of the indicia by the unaided eye will be difficult, however even a relatively low power loupe, say a 20× jewelers loupe which is commonly available will render the embedded optical patterns visible to a human observer. However, often the information encoding pattern will be machine readable codes (e.g., see FIGS. 14B and 14C), which can be used to encode information such as a part number for the electrical element or a website URL where additional information is provided. The exemplary pattern detection system 500 can be used for machine reading of the information encoding patterns 325.

The pattern detection system 500 includes a light source 505 and an image capture system 510. The image capture system 510 will generally include magnifying optics which forms an image of the information encoding pattern 325 on an image sensor. The image sensor in the image capture system 510 converts the optical signal to a digital image D(x,y) which is provided to a data processing system 515. Since the optically-detectable interference image 196 is a color image, the image capture system 510 preferably using a color image sensor to capture a color digital image. The data processing system 515 can perform various image analysis operations on the digital image including detecting the information encoding pattern and extracting information from the detected information encoding pattern. In a preferred embodiment, one or more actions are initiated in response to the detected pattern of information.

In some embodiments, the data processing system 515 can display the detected information encoding pattern 325 or information extracted by analyzing the information encoding pattern 325 on a display monitor 520. In some embodiments, an electrical element controller 522 can use information extracted by analyzing the information encoding pattern 325 to control the electrical element.

In some embodiments, the captured image can be analyzed to determine whether the electrical element 220 is authentic. If the information encoding pattern is missing or doesn't match the expected pattern the electrical element can be determined to be counterfeit. For example, a reference pattern of information can be defined corresponding to a captured image of the information encoding pattern for an authentic electrical element. The data processing system 515 can then compare the colors and geometry of the detected pattern of information to the colors and geometry of the reference pattern of information to determine with the electrical element 220 is authentic. In some embodiments, the colors of one or more elements in the detected pattern of information can be determined and compared to the colors of corresponding elements in the reference pattern of information. For example, if the optically-detectable interference image 196 corresponds to a company logo as shown in FIG. 14E, the colors of the first and second color regions 316, 317 can be compared to the expected reference colors. If the differences between the detected colors and the reference colors are below a specified threshold then the electrical element 220 can be deemed to be authentic. Likewise, the geometry of the detected pattern of information can also be compared to the geometry of the reference pattern. An authentication signal can be provided by the data processing system 515 to provide an indication of whether the electrical element 220 is authentic.

In some configurations, a difference image can be computed between the detected pattern of information and the reference pattern of information. The difference image can be analyzed to determine whether the electrical element 220 is authentic. For example, on or more difference statistics such as the average difference or the maximum difference can be determined and compared to predefined threshold value to determine with the detected pattern of information corresponds to the optically-detectable interference image 196 for an authentic electrical element.

Preferably, an image alignment operation can be performed before computing the difference image to align the detected pattern of information with the reference pattern of information. The alignment operation can perform appropriate image translation, image magnification and image skewing operations to align the images. Algorithms for aligning images are well-known in the image processing art, and any appropriate image alignment algorithms can be used in accordance with the present invention.

Figure 18A:
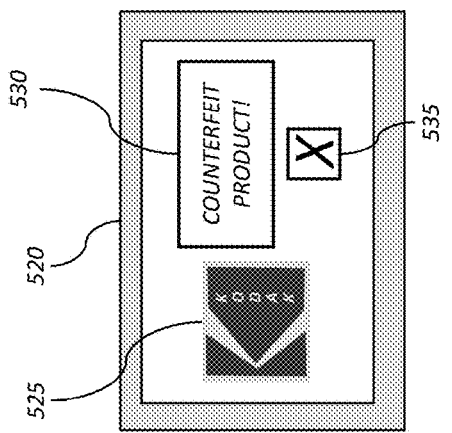
FIGS. 18A-18D illustrate examples of different information that can be displayed responsive to detecting the pattern of information encoded in a thin-film electrical element.
Figure 18B:
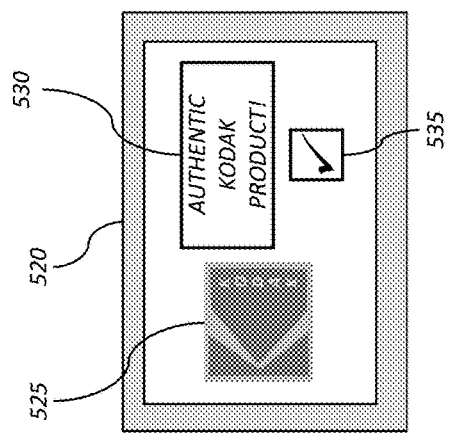

In some embodiments, after the data processing system 515 analyzes the detected pattern of information to determine whether the electrical element 220 is authentic, an authentication signal can be provided to a user (e.g., by displaying appropriate information on the display 520). For example, the display 520 can show a copy of the captured image 525 together with an authentication message 530 and/or an authentication graphic 535 as illustrated in FIGS. 18A-18B. In FIG. 18A, the authentication message 530 and the authentication graphic 535 indicate that the electrical element 220 is authentic, and in FIG. 18B, the authentication message 530 and the authentication graphic 535 indicate that the electrical element 220 is counterfeit. The displayed captured image 525 can also be viewed by the user. In FIG. 18B it can be seen that the color and geometry of the captured image 525 differ from those of the authentic product (see FIG. 18A).

Figure 18C:
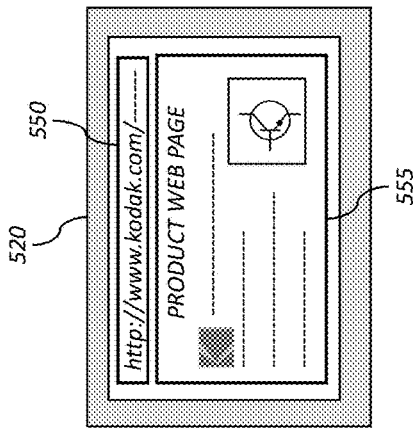

In some cases, the optically-detectable interference image 196 can include information identifying the electrical element 220. For example, the optically-detectable interference image 196 can include a text string showing the product identification as shown in FIG. 14A, or can include a bar code which encodes such information as shown in FIG. 14B. In such cases, the data processing system 515 can analyze the detected image to extract the product identification information. For example, if the optically-detectable interference image 196 includes a bar code which stores a product identification number (e.g., a part number or a serial number) for the electrical element 220, the decoded product identification 540 can be displayed on the display 520 as shown in FIG. 18C. In some configurations, the data processing system can also access other information about the electrical element based on the decoded product identification and can display that information (e.g., a product data sheet 545) on the display 520.

Figure 18D:
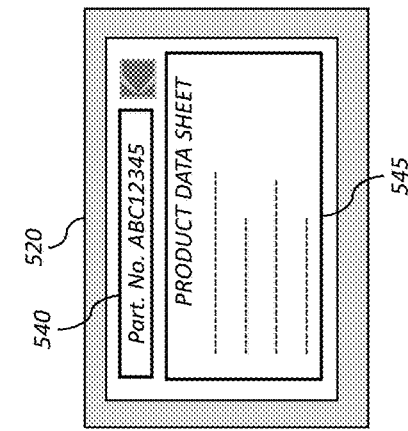

In some cases, the optically-detectable interference image 196 can include a QR code which stores a URL for a web page as shown in FIG. 14C. In such cases, the data processing system 515 can analyze the detected image to extract the web page URL 550 and use a web browser to display the corresponding web page 555 on the display 520 as shown in FIG. 18D. For example, the QR code can store the URL for a web page 555 having product information for the electrical element 220.

In some embodiments, information extracted from the detected pattern of information can be used to control, use or interrogate the electrical element 220. For example, the encoded information can include instructions for use or testing of the electrical element (e.g., the encoding information could provide a link to the appropriate electrical testing protocol). In this case, the electrical element controller 522 can access the testing protocol and can initiate the appropriate testing procedure. In some applications, the electrical element controller 522 can provide a wake-up signal, enabling the electrical element functionality only if the proper encoded information is present. In another application, the electrical element controller can tell the electrical element to send a signal over the internet or wirelessly to the manufacturer.

SECTION IV: INVENTIVE EXAMPLES

The preparation of thin film coatings of the material layers on glass substrates as used in the examples is described below. The SALD coating device used to prepare these layers, namely aluminum oxide, ZnO:N, and Al-doped ZnO (AZO), has been described in detail in commonly-assigned U.S. Patent Application Publication 2009/0130858, which is incorporated herein by reference. The coating device includes a delivery head with an output face that contains spatially separated elongated gas channels and operates on a gas bearing principle. Each gas channel includes an output slot which supplies gas to the output face, and adjacent exhaust slots which remove gas from the output face. In an exemplary configuration, the order of the gas channels is P-O-P-M-P-O-P-M-P-O-P where P represents a purge channel, O represents a channel containing an oxygen based precursor, and M represents a channel containing a metal based precursor. The flow of gases from the delivery head additionally act to maintain a gap between substrate and delivery head. As a substrate moves relative to the delivery head it sees the above sequence of gases which results in ALD deposition.

Inventive Example #1: Halftone Image on Reflective Conductor

Figure 19A:
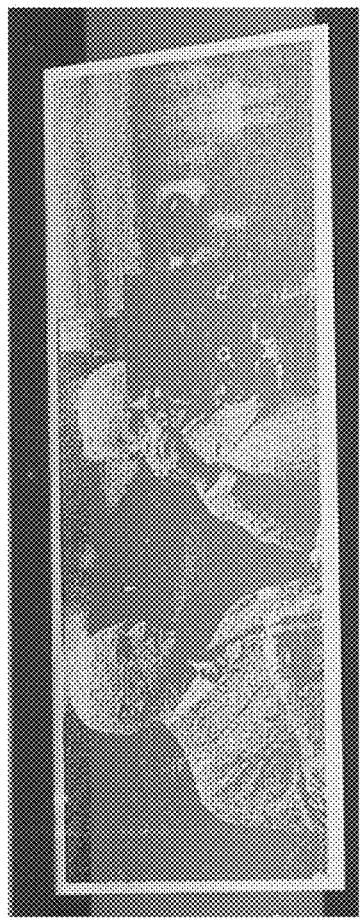
FIG. 19A-19B illustrate optically-detectable interference images formed on a conductive element and a capacitor, respectively.
Figure 19B:

This example was fabricated using a combination of spatial ALD and selective area deposition (SAD). A 2.5 inch square substrate with 100 nm of chromium was used as the substrate. A grey scale image was converted to a halftone image using Photoshop, and then converted to a binary image. The image pattern was inverted, to be used for selective area deposition. A Dimatix 2500 printer was used to print an inhibitor ink. The inhibitor ink was a 2 wt % polyvinyl pyrrolidone (PVP) k30 in diacetone alcohol solution. The printing was done using the 10 pL cartridge which resulted in a spot size on the substrate of approximately 90 µm under typical operating conditions. The patterns were printed at a pixel-to-pixel distance of 70 µm (363 dpi). After printing the image pattern on the chromium substrate, a layer of ZnO was deposited. A thickness of 75 nm was chosen to give provide a blue color in reflection. The resulting optical interference image formed upon illumination with a light source is shown in FIG. 19A. The use of a ZnO pattern on a reflective metal line is representative of the patterns and techniques that can be used to place embedded information over conductive elements such as pads and bus bars, without impacting the function of the conductor. Furthermore, the thickness and refractive index of the patterned layer can be chosen as in this example to provide the desired color.

Inventive Example #2: Halftone Image on Capacitor

This example was fabricated using a combination of spatial ALD and selective area deposition (SAD). A 2.5 inch square substrate with 100 nm of chromium was used as the substrate. The chromium functions as the bottom electrode of the capacitor. A grey scale image was converted to a halftone image using Photoshop. The image pattern was inverted, to be used for selective area deposition. The printing of the inhibitor ink was the same as described with respect to Inventive Example #1. Over the chromium, 25 nm of unpatterned $Al_2O_3$ was deposited using SALD. Next, large square top electrodes were defined by printing the inhibitor over the $Al_2O_3$ and depositing 75 nm of AZO. The inhibitor was removed, and the image pattern was printed. An additional 75 nm of AZO was deposited resulting in a top electrode of the capacitor structure having areas of 75 nm AZO thickness and 150 nm AZO thickness. This variability in AZO thickness (transparent conductor) does not impact the device performance. Two capacitors were fabricated with different patterns of embedded information as shown in FIG. 9B. The capacitance was measured to be around 2 pF. The capacitance of the devices was equivalent within the measurement noise showing that the embedded information within the top electrode area did not impact the device performance, even though it was in an active area of the capacitors.

The invention has been described in detail with particular reference to certain preferred embodiments thereof, but it will be understood that variations and modifications can be effected within the spirit and scope of the invention.

PARTS LIST 5 incident light wave
6 reflected light wave
6' reflected light wave
10 thin-film stack
13 air
14 layer
15 layer
100 thin-film transistor (TFT)
105 capacitor
110 substrate
115 thin-film layers
120 conductive layer
130 dielectric layer
140 dielectric layer
140a dielectric material
140b dielectric material
150 dielectric stack
170 semiconductor layer
180 conductive layer
181 source
182 drain
183 gate electrode
185 conductive layer
194 incident light
196 interference image
200 thin-film transistor (TFT)
205 capacitor
210 optical layer structure
210a optical layer structure
210b optical layer structure
210c optical layer structure
220 electrical element
300 electrical element physical design
305 designate encoding region step
310 encoding region
310a encoding region
310b encoding region
310c encoding region
315 pattern of information
316 first color region
317 second color region
320 determine information-encoding patterns step
325 information-encoding pattern
325a information-encoding pattern
325b information-encoding pattern
325c information-encoding pattern
330 update physical design step
335 modified electrical element physical design
340 fabricate electrical element process
345 electrical element with embedded information
420 conductive layer pattern
430 dielectric layer pattern
440 dielectric layer pattern
445 modified dielectric layer pattern
470 semiconductor layer pattern
480 conductive layer pattern
500 pattern detection system
505 light source
510 image capture system
515 data processing system
520 display
522 electrical element controller
525 captured image
530 authentication message
535 authentication graphic
540 product identification
545 product data sheet
550 web page URL
555 web page
605 inhibitor pattern
610 inhibitor pattern
615 inhibitor pattern
620 plan view
622 thin-film stack
623 thin-film stack
624 thin-film stack
625 thin-film stack
626 thin-film stack
627 thin-film stack
628 thin-film stack
629 thin-film stack
630 cross-sectional view
705 inhibitor pattern
710 inhibitor pattern
715 inhibitor pattern
722 thin-film stack
723 thin-film stack
724 thin-film stack
725 thin-film stack
726 thin-film stack
727 thin-film stack
728 thin-film stack
729 thin-film stack
730 cross-sectional view

The invention claimed is:

1. A method for decoding a pattern of information embedded in an electrical element, comprising:

receiving a thin-film electrical element including a plurality of thin-film layers on a substrate, the plurality of thin-film layers overlapping in an encoding region to form an optical layer structure, wherein at least one of the thin-film layers in the optical layer structure contributes to an electrical function of the electrical element, and wherein at least one of the thin-film layers in the optical layer structure includes an information-encoding pattern which contributes to the optically-detectable interference image;

illuminating the thin-film electrical element with an incident light beam from a light source thereby producing an optically-detectable interference image including the embedded pattern of information;

using an image capture system to capture an image of the optically-detectable interference image to form a captured image;

using a data processing system to analyze the captured image of the optically-detectable interference image to detect the embedded pattern of information; and initiating one or more actions in response to the detected pattern of information.

2. The method of claim 1, wherein the initiated actions include displaying the detected pattern of information to a user on a soft-copy display.

3. The method of claim 1, wherein the data processing system compares the detected pattern of information to a reference pattern of information to determine whether the electrical element is authentic, and wherein the initiated actions include providing an authentication signal which indicates whether the electrical element is authentic.

4. The method of claim 3, wherein the comparison of the detected pattern of information to the reference pattern of information includes comparing colors: of one or more elements in the detected pattern of information to colors of corresponding elements in the reference pattern of information.

5. The method of claim 3, wherein the comparison of the detected pattern of information to the reference pattern of information includes comparing a geometry of the detected pattern of information to a geometry of the reference pattern of information.

6. The method of claim 1, wherein the detected pattern of information includes a QR code which stores a URL for a web page, and wherein the initiated actions include displaying the web page.

7. The method of claim 1, wherein the detected pattern of information includes information identifying the electrical element, and wherein the initiated actions include displaying information about the electrical element.

8. The method of claim 1, wherein the initiated actions include controlling the electrical element responsive to the detected pattern of information.

9. A pattern detection system for detecting a pattern of information embedded in a thin-film electrical element, comprising:
  an illumination system for illuminating the thin-film electrical element with an incident light beam thereby producing an optically-detectable interference image including the embedded pattern of information, wherein the thin-film electrical element includes a plurality of thin-film layers on a substrate, the plurality of thin-film layers overlapping in an encoding region to form an optical layer structure, wherein at least one of the thin-film layers in the optical layer structure contributes to an electrical function of the electrical element, and wherein at least one of the thin-film layers in the optical layer structure includes an information-encoding pattern which contributes to the optically-detectable interference image;
  an image capture system for capturing an image of the optically-detectable interference image to form a captured image; and
  a data processing system that analyzes the captured image to detect the embedded pattern of information, wherein the pattern detection system initiates one or more actions in response to the detected pattern of information.

* * * * *